(12) United States Patent
Kim et al.

(10) Patent No.: US 11,839,136 B2
(45) Date of Patent: Dec. 5, 2023

(54) METHOD OF MANUFACTURING DISPLAY PANEL

(71) Applicant: SAMSUNG DISPLAY CO., LTD., Yongin-si (KR)

(72) Inventors: Kyungmin Kim, Yongin-si (KR); Junhyeong Park, Yongin-si (KR); Jiyeon Seo, Yongin-si (KR); Gyujeong Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 167 days.

(21) Appl. No.: 17/351,776

(22) Filed: Jun. 18, 2021

(65) Prior Publication Data

US 2022/0085342 A1 Mar. 17, 2022

(30) Foreign Application Priority Data

Sep. 17, 2020 (KR) .................. 10-2020-0120018

(51) Int. Cl.
*H10K 71/00* (2023.01)
*H10K 50/844* (2023.01)
*H10K 59/121* (2023.01)

(52) U.S. Cl.
CPC .......... *H10K 71/00* (2023.02); *H10K 50/844* (2023.02); *H10K 59/1213* (2023.02)

(58) Field of Classification Search
CPC .............. H01L 51/5253; H01L 51/003; H01L 51/5246; H10K 71/00; H10K 50/844; H10K 59/1213; H10K 50/865; H10K 59/1201; H10K 77/10; H10K 71/80; H10K 59/12; H10K 50/8426; Y02E 10/549

See application file for complete search history.

(56) References Cited

U.S. PATENT DOCUMENTS

| 10,644,087 | B2 | 5/2020 | Ee et al. |
| 10,693,109 | B2 | 6/2020 | Kim et al. |
| 10,756,156 | B2 | 8/2020 | Sung et al. |
| 2018/0145145 | A1* | 5/2018 | Chen .................. H01L 21/0337 |

(Continued)

FOREIGN PATENT DOCUMENTS

| KR | 1020190096467 A | 8/2019 |
| KR | 1020190104090 A | 9/2019 |
| KR | 102121257 B1 | 6/2020 |

*Primary Examiner* — Kyoung Lee
(74) *Attorney, Agent, or Firm* — CANTOR COLBURN LLP

(57) ABSTRACT

A method of manufacturing a display panel includes: preparing a support substrate including a first area and a second area that are spaced apart from each other, and a third area between the first area and the second area; forming, on the support substrate, a blocking layer located in the first area; forming, on the support substrate, a substrate material layer located in the first through third areas; removing a portion of the substrate material layer corresponding to the third area, to form a dummy substrate in the first area and a substrate in the second area; and separating the substrate from the support substrate, wherein the dummy substrate includes a plurality of protrusions protruding toward the substrate, and the substrate defines a plurality of through-portions corresponding to the plurality of protrusions, wherein an edge of each of the plurality of protrusions includes an uneven portion.

21 Claims, 22 Drawing Sheets

(56) References Cited

U.S. PATENT DOCUMENTS

| | | | | |
|---|---|---|---|---|
| 2019/0181376 A1* | 6/2019 | Kim | .................... | H01L 27/3246 |
| 2020/0020752 A1* | 1/2020 | Shi | ...................... | H04M 1/0266 |
| 2021/0045242 A1* | 2/2021 | Tanaka | ................. | H05K 3/4682 |
| 2022/0013399 A1* | 1/2022 | Rondon | ................... | C23C 14/10 |
| 2022/0020906 A1* | 1/2022 | Kim | ...................... | H01L 27/156 |

* cited by examiner

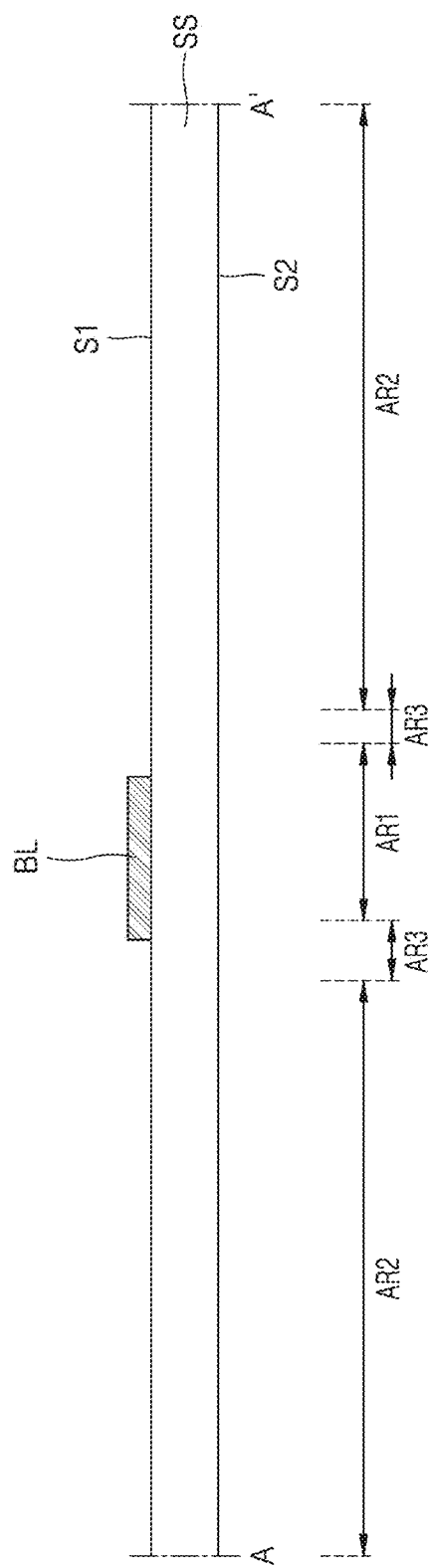

METHOD OF MANUFACTURING DISPLAY PANEL

This application claims priority to Korean Patent Application No. 10-2020-0120018, filed on Sep. 17, 2020, and all the benefits accruing therefrom under 35 U.S.C. § 119, the content of which in its entirety is herein incorporated by reference.

BACKGROUND

1. Field

One or more embodiments relate to a method of manufacturing a display panel.

2. Description of Related Art

A display apparatus is an apparatus for visually displaying data. A display panel provided in the display apparatus displays an image. A plurality of pixels is formed in a display area of the display panel. A scan line and a data line are formed on the display panel to be insulated from each other, and a pixel circuit including a thin-film transistor and a storage capacitor corresponding to each of the plurality of pixels is included in the display panel. Various wirings for transmitting an electrical signal to the pixel circuit of the display area, a scan driver, a data driver, a controller, etc. may be provided in a peripheral area of the display panel. The peripheral area may be a non-display area where an image is not displayed.

The display apparatus has been used for various purposes. Also, as a thickness and a weight of the display apparatus have decreased, the range of applications of the display apparatus has increased. Also, efforts to reduce the area of a non-display area and increase the area of a display area continue.

At least a part of a display panel may be bent at a certain curvature to have a curved surface, and a flexible substrate including a synthetic resin or the like is used to implement such a display panel. Because such a flexible substrate is easily bent, handling in a manufacturing process may be difficult. Accordingly, after several processes are performed by forming a flexible substrate on a support substrate having sufficient rigidity, a process of separating the flexible substrate from the support substrate may be performed.

SUMMARY

One or more embodiments include a method of manufacturing a display panel in which a display area is formed even at a corner of the display panel to extend the display area. To this end, embodiments may use a flexible substrate.

However, in a process of separating the flexible substrate from a support substrate, materials that need to remain on the support substrate may be separated along with the flexible substrate, thereby causing defects in the quality of the display panel.

One or more embodiments provide a method of manufacturing a display panel which may improve the manufacturing quality of the display panel. However, the embodiments are examples, and do not limit the scope of the present disclosure.

Additional aspects will be set forth in part in the description which follows and, in part, will be apparent from the description, or may be learned by practice of the presented embodiments.

According to one or more embodiments, a method of manufacturing a display panel includes: preparing a support substrate including a first area, a second area, and a third area, where the first and second areas are spaced apart from each other, and the third area is disposed between the first area and the second area, forming, on the support substrate, a blocking layer located in the first area, forming, on the support substrate, a substrate material layer located in the first through third areas, removing a portion of the substrate material layer corresponding to the third area, to form a dummy substrate in the first area and a substrate in the second area, and separating the substrate from the support substrate, wherein the dummy substrate includes a plurality of protrusions protruding toward the substrate, and the substrate defines a plurality of through-portions corresponding to the plurality of protrusions, wherein an edge of each of the plurality of protrusions includes an uneven portion.

An edge of each of the plurality of through-portions may include a straight portion.

The edge of each of the plurality of protrusions may include a first convex portion, a second convex portion, and a concave portion, and the concave portion is located between the first convex portion and the second convex portion and is relatively concave. At least one of the first convex portion and the second convex portion has a shape corresponding to a part of a polygonal shape, a part of a circular shape, or a part of an elliptical shape in a plan view.

Each of the plurality of protrusions may have a serpentine shape.

The forming of the substrate material layer may include forming, on the support substrate, a first organic material layer located in the first through third areas, and forming, on the first organic material layer, a first inorganic material layer including a $1\text{-}1^{th}$ inorganic material layer corresponding to the first area and a $1\text{-}2^{th}$ inorganic material layer corresponding to the second area.

The removing of the portion of the substrate material layer corresponding to the third area may include etching a portion of the first organic material layer corresponding to the third area, wherein the etched first organic material layer includes a $1\text{-}1^{th}$ organic material layer in the first area and a $1\text{-}2^{th}$ organic material layer in the second area.

The dummy substrate may include a stacked structure of the $1\text{-}1^{th}$ organic material layer and the $1\text{-}1^{th}$ inorganic material layer, wherein the $1\text{-}1^{th}$ inorganic material layer includes a first tip protruding from a side surface of the $1\text{-}1^{th}$ organic material layer toward the substrate.

The substrate may include a stacked structure of the $1\text{-}2^{th}$ organic material layer and the $1\text{-}2^{th}$ inorganic material layer, wherein the $1\text{-}2^{th}$ inorganic material layer includes a second tip protruding from a side surface of the $1\text{-}2^{th}$ organic material layer toward the dummy substrate.

A protrusion length of at least a portion of the first tip may be greater than a protrusion length of the second tip.

The forming of the substrate material layer may further include forming a second organic material layer covering the $1\text{-}1^{th}$ inorganic material layer and the $1\text{-}2^{th}$ inorganic material layer and located in the first through third areas, and forming, on the second organic material layer, a $2\text{-}1^{th}$ inorganic material layer corresponding to the first area and a $2\text{-}2^{th}$ inorganic material layer corresponding to the second area.

The removing of the portion of the substrate material layer corresponding to the third area may include etching portions of the first organic material layer and the second organic material layer that correspond to the third area, wherein the etched first organic material layer includes a 1-1$^{th}$ organic material layer in the first area and a 1-2$^{th}$ organic material layer in the second area, and the etched second organic material layer includes a 2-1$^{th}$ organic material layer in the first area and a 2-2$^{th}$ organic material layer in the second area.

The dummy substrate may include a stacked structure of the 1-1$^{th}$ organic material layer, the 1-1$^{th}$ inorganic material layer, the 2-1$^{th}$ organic material layer, and the 2-1$^{th}$ inorganic material layer, wherein the 1-1$^{th}$ inorganic material layer includes a first tip protruding from a side surface of the 1-1$^{th}$ organic material layer toward the substrate, and the 2-1$^{th}$ inorganic material layer includes a third tip protruding from a side surface of the 2-1$^{th}$ organic material layer toward the substrate.

A protrusion length of the first tip may be greater than a protrusion length of the third tip.

The separating of the substrate from the support substrate may include separating the substrate from the support substrate, by emitting a laser from a bottom of the support substrate to the substrate through the support substrate.

When the substrate is separated from the support substrate, the blocking layer and the dummy substrate on the blocking layer may not be separated from the support substrate.

The blocking layer may include an amorphous silicon material.

The method may further include forming, on the substrate, a thin-film encapsulation layer including at least one inorganic encapsulation layer and at least one organic encapsulation layer, wherein when the substrate is separated from the support substrate, a part of the at least one organic encapsulation layer remains on the support substrate due to the first tip.

The part of the at least one organic encapsulation layer remaining on the support substrate may be located in the third area.

The method may further include forming, on the substrate material layer, a pixel circuit layer including a thin-film transistor, and forming, on the pixel circuit layer, a display element layer including a display element electrically connected to the thin-film transistor.

The substrate may include a plurality of strip portions located between the plurality of through-portions and defining the plurality of through-portions, wherein the plurality of strip portions is located at a corner of the substrate.

The method may further include reducing an interval between adjacent strip portions from among the plurality of strip portions.

Other aspects, features, and advantages of the present disclosure will become more apparent from the drawings, the claims, and the detailed description.

These general and specific embodiments may be implemented by using a system, a method, a computer program, or a combination thereof.

BRIEF DESCRIPTION OF THE DRAWINGS

The above and other aspects, features, and advantages of certain embodiments will be more apparent from the following description taken in conjunction with the accompanying drawings, in which:

FIGS. 7A and 7B are a plan view and a cross-sectional view, respectively, illustrating some operations of a method of manufacturing a display panel, according to an embodiment;

DETAILED DESCRIPTION

Figure 1:
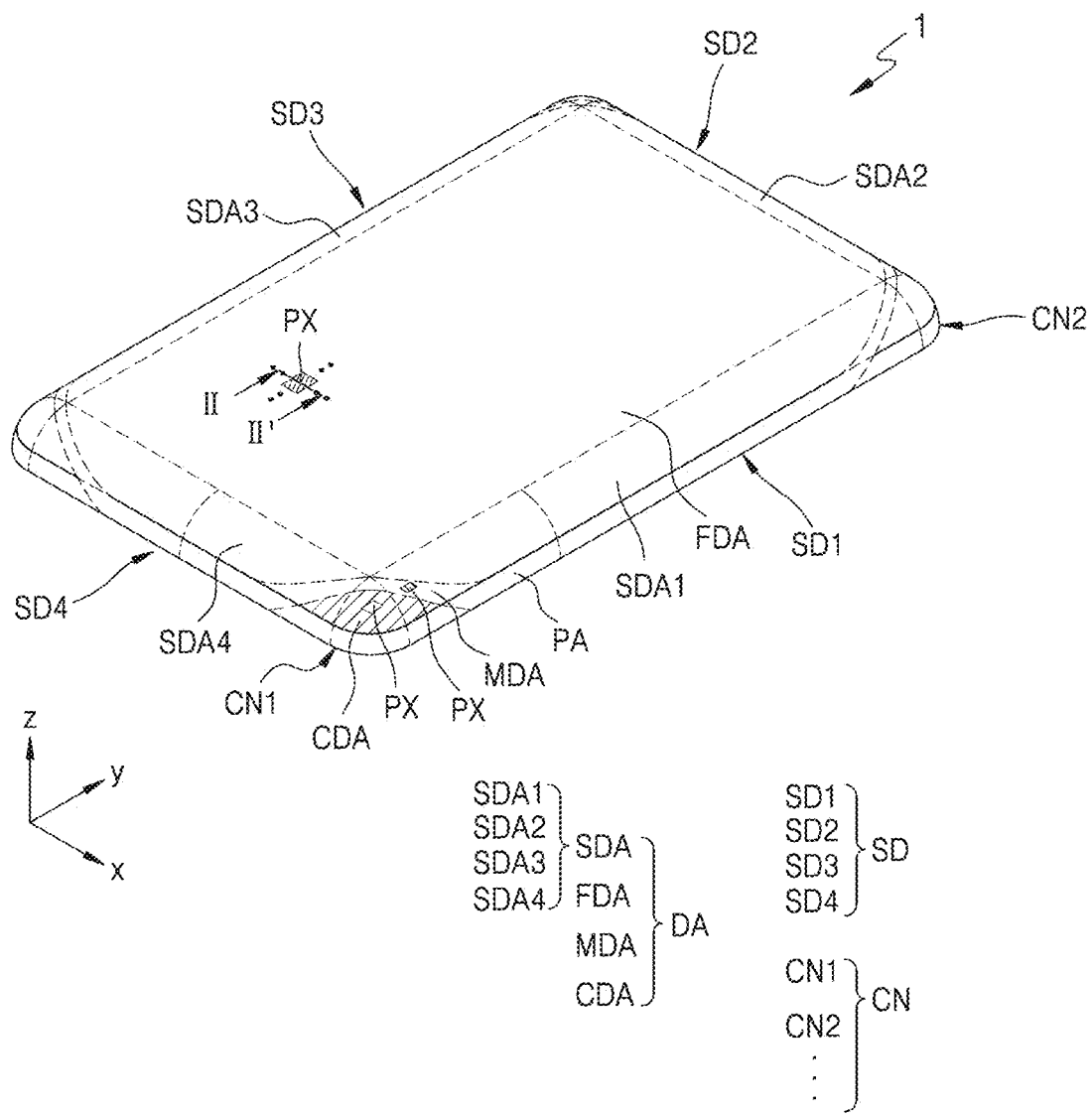
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the detailed description. Effects and features of the present disclosure, and methods for achieving them will be clarified with reference to embodiments described below in detail with reference to the drawings. However, the present disclosure according to the invention is not limited to the following embodiments and may be embodied in various forms.

Hereinafter, embodiments will be described in detail with reference to the accompanying drawings, wherein like elements are denoted by like reference numerals throughout and a repeated description thereof is omitted.

It will be understood that although the terms "first," "second," etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," "having," and "comprising" used herein are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of elements in the drawings may be exaggerated or contracted for convenience of explanation. For example, because sizes and thicknesses of elements in the drawings are arbitrarily illustrated for convenience of explanation, the present disclosure according to the invention is not limited thereto.

When a certain embodiment may be implemented differently, a specific process order may be different from the described order. For example, two consecutively described processes may be performed substantially at the same time or performed in an order opposite to the described order.

"A and/or B" is used herein in order to select only A, select only B, or select both A and B. "At least one of A and B" is used to select only A, select only B, or select both A and B.

It will be understood that when a layer, an area, or an element is referred to as being "connected" to another layer, area, or element, it may be "directly connected" to the other layer, area, or element and/or may be "indirectly connected" to the other layer, area, or element with other layers, areas, or elements interposed therebetween. For example, when layers, areas, or elements are referred to as being "electrically connected," they may be directly electrically connected, and/or may be indirectly electrically connected with intervening layers, areas, or elements therebetween.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of a display apparatus according to an embodiment.

Referring to FIG. 1, a display apparatus 1 may have a quadrangular shape in a plan view. Alternatively, the display apparatus 1 may have any of various shapes such as a polygonal shape (e.g., a triangular shape or a quadrangular shape), a circular shape, or an elliptical shape. For convenience of explanation, the following will be described assuming that the display apparatus 1 has a quadrangular shape in a plan view.

The display apparatus 1 may have four side portions SD and four corner portions CN. A first side portion SD1 and a third side portion SD3 of the side portions SD may extend in a first direction (e.g., a y-direction), and may be located opposite to each other. A second side portion SD2 and a fourth side portion SD4 of the side portions SD may extend in a second direction (e.g., an x-direction), and may be located opposite to each other.

Each of the corner portions CN may be located between two adjacent side portions of the side portions SD, and may connect the two adjacent side portions SD. For example, a first corner portion CN1 may be located between the first side portion SD1 and the fourth side portion SD4 that are adjacent to each other, and a second corner portion CN2 may be located between the first side portion SD1 and the second side portion SD2 that are adjacent to each other.

Each of the first through fourth side portions SD1, SD2, SD3, and SD4 of the display apparatus 1 may have a curved surface bent in a certain direction to have a certain curvature. For example, the first side portion SD1 may have a curved surface bent with respect to the y-axis as a bending axis, and the second side portion SD2 may have a curved surface bent with respect to the x-axis as a bending axis. Curvatures of the first through fourth side portions SD1, SD2, SD3, and SD4 may be the same or different from one another.

Two adjacent side portions SD with the corner portion CN therebetween may have curved surfaces bent along bending axes of different directions. Because the corner portion CN connects the two adjacent side portions SD, the corner portion CN may have a curved surface that continuously connects curved surfaces bent in multiple directions.

The display apparatus 1 may include a display area DA and a peripheral area PA located outside the display area DA. A plurality of pixels PX may be located in the display area DA, and the display apparatus 1 may provide an image through the plurality of pixels PX arranged in the display area DA. For example, each of the plurality of pixels PX may emit red light, green light, or blue light, and the display apparatus 1 may provide an image by using light emitted by each of the plurality of pixels PX.

The display area DA may include a front display area FDA, side display areas SDA, corner display areas CDA, and intermediate display areas MDA. For example, independent images may be provided the pixels PX located in the front display area FDA, the side display areas SDA, the corner display areas CDA, and the intermediate display areas MDA, respectively. Alternatively, one image may be provided by the pixels PX located in the front display area FDA, the side display areas SDA, the corner display areas CDA, and the intermediate display areas MDA.

The front display area FDA may be a flat display area, and may have a quadrangular shape in a plan view. The front display area FDA may be located at a central portion of the display apparatus 1.

The side display areas SDA may be display areas adjacent to four edges of the front display area FDA, respectively, and may include first through fourth side display areas SDA1, SDA2, SDA3, and SDA4. The first through fourth side display areas SDA1, SDA2, SDA3, and SDA4 may be located on first through fourth side portions SD1, SD2, SD3, and SD4 of the display apparatus 1, respectively. Each of the side display areas SDA located on the side portions SD may be bent to have a certain curvature. Curvatures of the first through fourth side display areas SDA1, SDA2, SDA3, and SDA4 may be the same or different from one another. Because the side display area SDA is bent, the beauty of the display apparatus 1 may be improved and more spaces to display images may be secured compared to a display apparatus that has only one flat display area.

The corner display areas CDA may be located at corners of the front display area FDA, and may be spaced apart from the front display area FDA. The corner display areas CDA may be located at the corner portions CN of the display apparatus 1, respectively.

The intermediate display area MDA may be located between the front display area FDA and the corner display area CDA, and may extend between the side display area SDA and the corner display area CDA.

The peripheral area PA where an image is not provided may be a non-display area. The peripheral area PA may entirely or partially surround the display area DA. A driver or the like for applying an electrical signal or power to each of the plurality of pixels PX may be located in the peripheral area PA. A pad to which an electronic device or a printed circuit board may be electrically connected may be located in the peripheral area PA.

The display apparatus 1 may be used as a display screen of not only a portable electronic device such as a mobile phone, a smartphone, a tablet personal computer ("PC"), a mobile communication terminal, an electronic organizer, an electronic book, a portable multimedia player ("PMP"), a navigation device, or an ultra-mobile PC ("UMPC") but also any of various products such as a television, a laptop computer, a monitor, an advertisement board, or an Internet of things ("IoT") product. Also, the display apparatus 1 according to an embodiment may be used in a wearable device such as a smart watch, a watch phone, a glasses-type display, or a head-mounted display ("HMD"). Also, the display apparatus 1 according to an embodiment may be used as a center information display ("CID") located on an instrument panel, a center fascia, or a dashboard of a vehicle, a room mirror display replacing a side-view mirror of a vehicle, or a display located on the back of a front seat for entertainment for a back seat of a vehicle.

Figure 2:
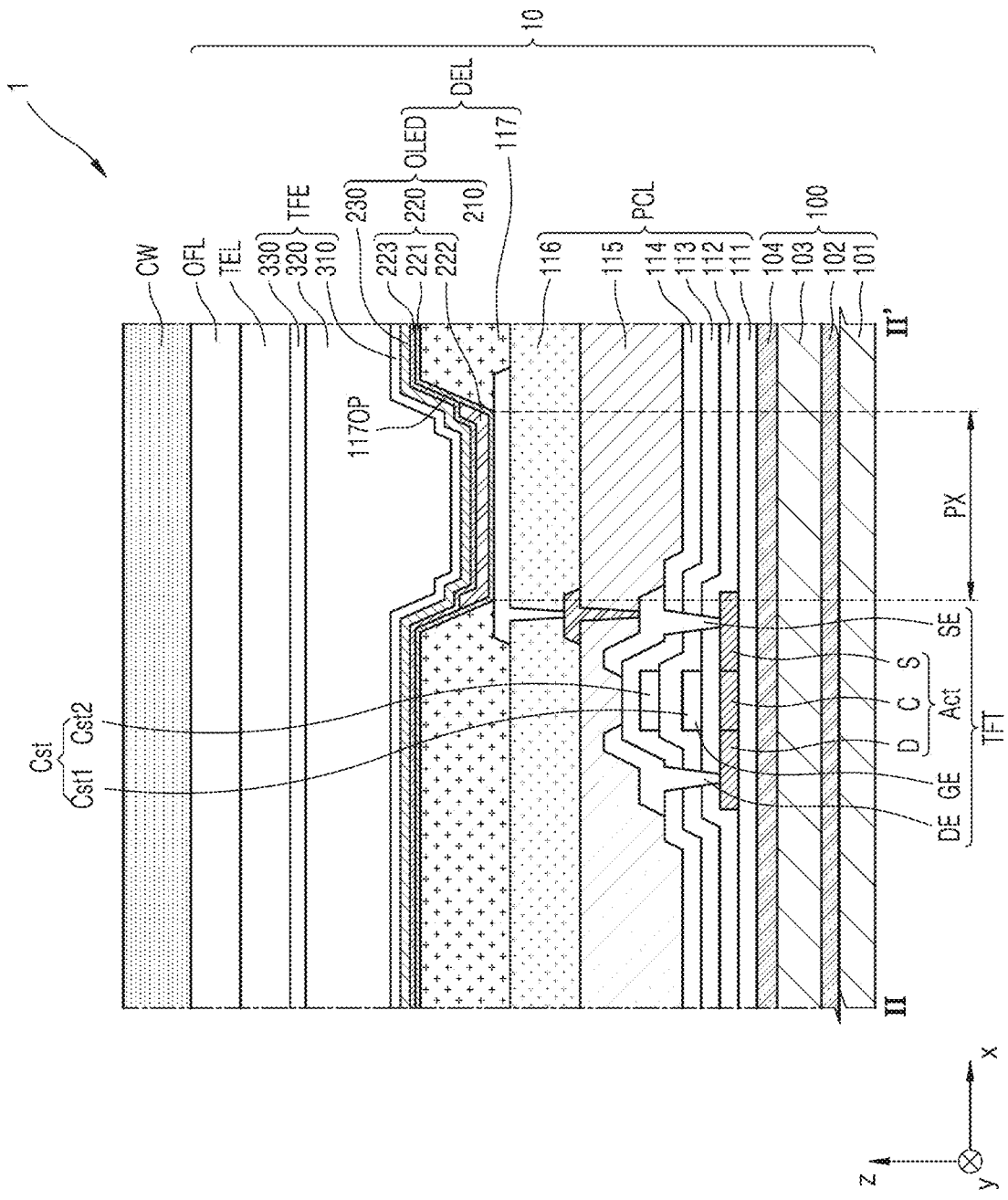
FIG. 2 is a cross-sectional view illustrating a part of the display apparatus of FIG. 1.

FIG. 2 is a cross-sectional view illustrating a part of the display apparatus 1 of FIG. 1. FIG. 2 is a cross-sectional view of the display apparatus 1, taken along line II-II' of FIG. 1.

Referring to FIG. 2, the display apparatus 1 may include a display panel 10, and the display panel 10 may have a stacked structure of a substrate 100, a pixel circuit layer PCL, a display element layer DEL, a thin-film encapsulation layer TFE, a touch electrode layer TEL, and an optical functional layer OFL.

The substrate 100 may have a multi-layer structure including a base layer including a polymer resin and an inorganic layer. For example, the substrate 100 may include a base layer including a polymer resin and a barrier layer of an inorganic insulating layer. For example, the substrate 100 may include a first base layer 101, a first barrier layer 102, a second base layer 103, and a second barrier layer 104 that are sequentially stacked. Each of the first base layer 101 and the second base layer 103 may include polyimide ("PI"), polyethersulfone ("PES"), polyarylate, polyetherimide ("PEI"), polyethylene napthalate ("PEN"), polyethylene terephthalate ("PET"), polyphenylene sulfide ("PPS"), polycarbonate ("PC"), cellulose triacetate ("TAC"), and/or cellulose acetate propionate ("CAP"). Each of the first barrier layer 102 and the second barrier layer 104 may include an inorganic insulating material such as silicon oxide, silicon oxynitride, and/or silicon nitride. The substrate 100 may be flexible.

The pixel circuit layer PCL is located on the substrate 100. In FIG. 2, the pixel circuit layer PCL includes a thin-film transistor TFT, and a buffer layer 111, a first gate insulating layer 112, a second gate insulating layer 113, an interlayer insulating layer 114, a first planarization insulating layer 115, and a second planarization insulating layer 116 located under and/or over elements of the thin-film transistor TFT.

The buffer layer 111 may reduce or block penetration of a foreign material, moisture, or external air from the bottom of the substrate 100 and may planarize the substrate 100. The buffer layer 111 may include an inorganic insulating material such as silicon oxide, silicon oxynitride, or silicon nitride, and may have a single or multi-layer structure including the above material.

The thin-film transistor TFT on the buffer layer 111 may include a semiconductor layer Act, and the semiconductor layer Act may include polysilicon. Alternatively, the semiconductor layer Act may include amorphous silicon, an oxide semiconductor, or an organic semiconductor. The semiconductor layer Act may include a channel region C, and a drain region D and a source region S located on both sides of the channel region C. A gate electrode GE may overlap the channel region C.

The gate electrode GE may include a low-resistance metal material. The gate electrode GE may include a conductive material including molybdenum (Mo), aluminum (Al), copper (Cu), or titanium (Ti), and may have a single or multi-layer structure including the above material.

The first gate insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113 may cover the gate electrode GE. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), like the first gate insulating layer 112.

An upper electrode Cst2 of the storage capacitor Cst may be located on the second gate insulating layer 113. The upper electrode Cst2 may overlap the gate electrode GE located under the upper electrode Cst2. In this case, the gate electrode GE and the upper electrode Cst2 overlapping each other with the second gate insulating layer 113 therebetween may constitute the storage capacitor Cst. That is, the gate electrode GE may function as a lower electrode Cst1 of the storage capacitor Cst.

As such, the storage capacitor Cst and the thin-film transistor TFT may overlap each other. In some embodiments, the storage capacitor Cst may not overlap the thin-film transistor TFT.

The upper electrode Cst2 may include aluminum (Al), platinum (Pt), palladium (Pd), silver (Ag), magnesium (Mg), gold (Au), nickel (NI), neodymium (Nd), iridium (Ir), chromium (Cr), calcium (Ca), molybdenum (Mo), titanium (Ti), tungsten (W), and/or copper (Cu), and may have a single or multi-layer structure including the above material.

The interlayer insulating layer 114 may cover the upper electrode Cst2. The interlayer insulating layer 114 may include silicon oxide ($SiO_2$), silicon nitride ($SiN_x$), silicon oxynitride (SiON), aluminum oxide ($Al_2O_3$), titanium oxide (TiO$_2$), tantalum oxide (Ta$_2$O$_5$), hafnium oxide (HfO$_2$), or zinc oxide (ZnO$_2$). The interlayer insulating layer 114 may have a single or multi-layer structure including the above inorganic insulating material.

Each of a drain electrode DE and a source electrode SE may be located on the interlayer insulating layer 114. The drain electrode DE and the source electrode SE may be connected to the drain region D and the source region S through contact holes of insulating layers located under the drain electrode DE and the source electrode SE, respectively. Each of the drain electrode DE and the source electrode SE may include a material having high conductivity. Each of the drain electrode DE and the source electrode SE may include a conductive material including molybdenum (Mo), aluminum (Al), copper (Cu), or titanium (Ti), and may have a single or multi-layer structure including the above material. In an embodiment, each of the drain electrode DE and the source electrode SE may have a multi-layer structure including Ti/Al/Ti.

The first planarization insulating layer 115 may cover the drain electrode DE and the source electrode SE. The first planarization insulating layer 115 may include an organic insulating material such as a general-purpose polymer (e.g., polymethyl methacrylate ("PMMA") or polystyrene ("PS")), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The second planarization insulating layer 116 may be located on the first planarization insulating layer 115. The second planarization insulating layer 116 may include the same material as that of the first planarization insulating layer 115, and may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The display element layer DEL may be located on the pixel circuit layer PCL having the above structure. The display element layer DEL may include an organic light-emitting display ("OLED") as a display element, and the organic light-emitting diode OLED may have a stacked structure of a pixel electrode 210, an intermediate layer 220, and a common electrode 230. The organic light-emitting diode OLED may emit, for example, red, green, or blue light, or may emit red, green, blue, or white light. The organic light-emitting diode OLED may emit light through an emission area, and the emission area may be defined as the pixel PX.

The pixel electrode 210 of the organic light-emitting diode OLED may be electrically connected to the thin-film transistor TFT through contact holes formed in the second planarization insulating layer 116 and the first planarization insulating layer 115 and a contact metal CM located on the first planarization insulating layer 115.

The pixel electrode 210 may include a conductive oxide such as indium tin oxide ("ITO"), indium zinc oxide ("IZO"), zinc oxide (ZnO), indium oxide (In$_2$O$_3$), indium gallium oxide ("IGO"), or aluminum zinc oxide ("AZO"). In another embodiment, the pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 210 may further include a film formed of ITO, IZO, ZnO, or In$_2$O$_3$ over/under the reflective film.

A pixel-defining film 117 having an opening 1170P through which a central portion of the pixel electrode 210 is exposed is located on the pixel electrode 210. The pixel-defining film 117 may include an organic insulating material and/or an inorganic insulating material. The opening 1170P may define an emission area of light emitted by the organic light-emitting diode OLED. For example, a size/width of the opening 1170P may correspond to a size/width of the emission area. Accordingly, a size and/or a width of the pixel PX may depend on a size and/or a width of the opening 1170P of the pixel-defining film 117.

The intermediate layer 220 may include an emission layer 222 formed to correspond to the pixel electrode 210. The emission layer 222 may include a high molecular weight organic material or a low molecular weight organic material emitting light of a certain color. Alternatively, the emission layer 222 may include an inorganic light-emitting material, or may include quantum dots.

A first functional layer 221 and a second functional layer 223 may be located under and over the emission layer 222, respectively. The first functional layer 221 may include, for example, a hole transport layer ("HTL"), or may include a hole transport layer and a hole injection layer ("HIL"). The second functional layer 223 that is an element located on the emission layer 222 may include an electron transport layer ("ETL") and/or an electron injection layer ("EIL"). The first functional layer 221 and/or the second functional layer 223 may be a common layer formed to cover the entirety of the substrate 100, like the common electrode 230 described below.

The common electrode 230 may be located over the pixel electrode 210, and may overlap the pixel electrode 210. The common electrode 230 may be formed of a conductive material having a low work function. For example, the common electrode 230 may include a (semi)transparent layer including silver (Ag), magnesium (Mg), aluminum (Al) platinum (Pt), palladium (Pd), gold (Au), nickel (Ni), neodymium (Nd), iridium (Ir), chromium (Cr), lithium (Li), calcium (Ca), or an alloy thereof. Alternatively, the common electrode 230 may further include a layer formed of ITO, IZO, ZnO, or In$_2$O$_3$ on the (semi)transparent layer including the above material. The common electrode 230 may be integrally formed to cover the entirety of the substrate 100.

The thin-film encapsulation layer TFE may be located on the display element layer DEL and may cover the display element layer DEL. The thin-film encapsulation layer TFE may include at least one inorganic encapsulation layer and at least one organic encapsulation layer. In an embodiment, in FIG. 2, the thin-film encapsulation layer TFE includes a first inorganic encapsulation layer 310, an organic encapsulation layer 320, and a second inorganic encapsulation layer 330 that are sequentially stacked.

Each of the first and second inorganic encapsulation layers 310 and 330 may include at least one inorganic material from among aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy resin, polyimide, and polyethylene. In an embodiment, the organic encapsulation layer 320 may include acrylate. The organic encapsulation layer 320 may be formed by curing a monomer or applying a polymer. The organic encapsulation layer 320 may be transparent.

A touch electrode layer TEL including touch electrodes may be located on the thin-film encapsulation layer TFE, and the optical functional layer OFL may be located on the touch electrode layer TEL. The touch electrode layer TEL may obtain coordinate information according to an external input, for example, a touch event. The optical functional layer OFL may reduce a reflectance of light (external light) incident on the display apparatus 1, and/or improve color purity of light emitted from the display apparatus 1.

In an embodiment, the optical functional layer OFL may include a phase retarder and/or a polarizer. The phase retarder may be of a film type or a liquid crystal coating type, and may include a λ/2 phase retarder and/or a λ/4 phase retarder. The polarizer may also be of a film type or a liquid crystal coating type. The film type polarizer may include a stretchable synthetic resin film, and the liquid crystal coating type polarizer may include liquid crystals arranged in a certain arrangement. The phase retarder and the polarizer may further include a protective film.

In another embodiment, the optical functional layer OFL may have a destructive interference structure. The destructive interference structure may include a first reflective layer and a second reflective layer that are located on different layers. First reflected light and second reflected light reflected by the first reflective layer and the second reflective layer, respectively, may be destructively interfered with each other, thereby reducing a reflectance of external light.

An adhesive member may be located between the touch electrode layer TEL and the optical functional layer OFL. Any adhesive member that is known in the related art may be used without limitation. The adhesive member may be a pressure sensitive adhesive ("PSA").

A cover window CW may be located on the display panel 10. The cover window CW may be adhered to the display panel 10 by an adhesive member. The adhesive member may be, for example, a pressure sensitive adhesive (PSA).

The cover window CW may have a high transmittance to transmit light emitted from the display panel 10, and may have a small thickness to minimize a weight of the display apparatus 1. Also, the cover window CW may have high strength and high hardness to protect the display panel 10 from external impact. The cover window CW may include, for example, glass or plastic. In an embodiment, the cover window CW may include ultra-thin glass that has increased strength as a result of chemical strengthening or thermal strengthening.

Although the display apparatus 1 includes the organic light-emitting diode OLED as a display element, the display apparatus 1 of the present disclosure according to the invention is not limited thereto. In another embodiment, the display apparatus 1 may be an inorganic light-emitting display or an inorganic electroluminescent ("EL") display including an inorganic light-emitting diode. The inorganic light-emitting diode may include a PN junction diode including inorganic semiconductor-based materials. When a voltage is applied to the PN junction diode in a forward direction, holes and electrons may be injected, and energy generated by recombination of the holes and electrons may be converted into light energy to emit light of a certain color. The inorganic light-emitting diode may have a width of several to hundreds of micrometers, and in some embodiments, the inorganic light-emitting diode may be referred to as a micro-LED.

Figure 3:
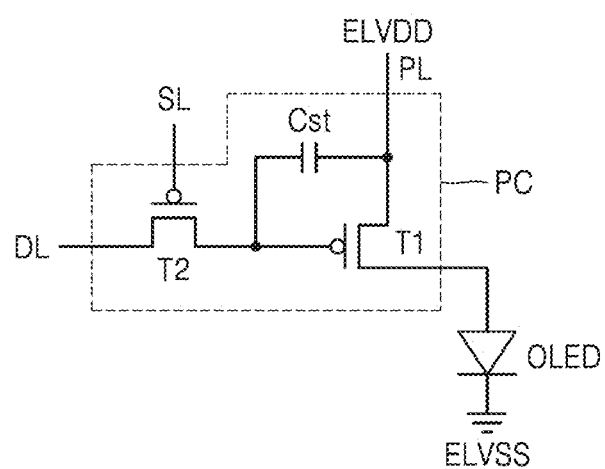
FIG. 3 is an equivalent circuit diagram of a pixel circuit included in a display apparatus according to an embodiment.

FIG. 3 is an equivalent circuit diagram of a pixel circuit included in a display apparatus according to an embodiment.

Referring to FIG. 3, a pixel circuit PC may include a plurality of thin-film transistors and a storage capacitor, and may be electrically connected to an organic light-emitting diode OLED. In an embodiment, the pixel circuit PC may include a driving thin-film transistor T1, a switching thin-film transistor T2, and a storage capacitor Cst.

The switching thin-film transistor T2 may be connected to a scan line SL and a data line DL, and may transmit a data signal or a data voltage input from the data line DL to the driving thin-film transistor T1 based on a scan signal or a switching voltage input from the scan line SL. The storage capacitor Cst may be connected to the switching thin-film transistor T2 and a driving voltage line PL, and may store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst, and may control driving current flowing from the driving voltage line PL to the organic light-emitting diode OLED according to a value of the voltage stored in the storage capacitor Cst. A common electrode (e.g., a cathode) of the organic light-emitting diode OLED may receive a second power supply voltage ELVSS. The organic light-emitting diode OLED may emit light having a certain luminance due to the driving current.

Although the pixel circuit PC includes two thin-film transistors and one storage capacitor, the present disclosure according to the invention is not limited thereto. For example, the pixel circuit PC may include three or more thin-film transistors and/or two or more storage capacitors. In an embodiment, the pixel circuit PC may include seven thin-film transistors and one storage capacitor. The number of thin-film transistors and storage capacitors may be changed in various ways according to a design of the pixel circuit PC. However, for convenience of explanation, the following will be described assuming that the pixel circuit PC includes two thin-film transistors and one storage capacitor.

Figure 4:
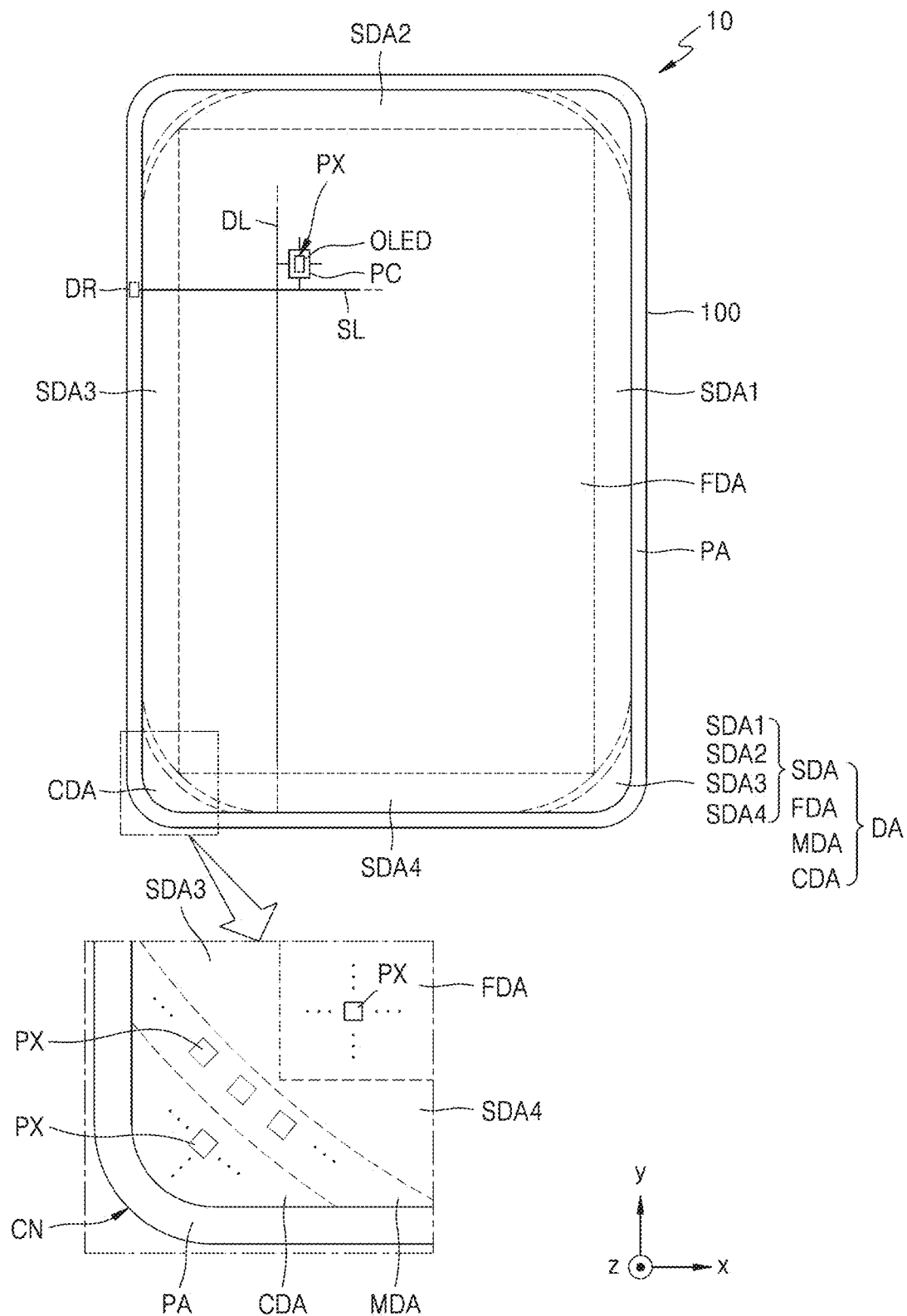
FIG. 4 is a plan view of a display panel according to an embodiment.

FIG. 4 is a plan view of a display panel according to an embodiment, illustrating a side of the display panel 10.

Referring to FIG. 4, the display panel 10 may include the substrate 100, and elements constituting the display panel 10 may be located on the substrate 100. The pixel circuit PC, the organic light-emitting diode OLED, a driver DR, and signal wirings (e.g., the data line DL and the scan line SL) may be located on the substrate 100 of the display panel 10.

As described with reference to FIG. 3, the pixel circuit PC may include a plurality of thin-film transistors TFT (see FIG. 3) and the storage capacitor Cst (see FIG. 3), and may drive the organic light-emitting diode OLED.

The organic light-emitting diode OLED may be electrically connected to the pixel circuit PC, and may receive driving current from the pixel circuit PC. The OLED receiving the driving current may emit light as a display element, and an emission area where light is emitted by the organic light-emitting diode OLED may be defined as the pixel PX. Because an area where the pixel PX is located may display an image, the display area DA may be formed.

The display area DA may include the front display area FDA, the first through four side display areas SDA1, SDA2, SDA3, and SDA4, the corner display areas CDA, and the intermediate display areas MDA. The pixels PX may be located in the front display area FDA, the first through four side display areas SDA1, SDA2, SDA3, and SDA4, the corner display areas CDA, and the intermediate display areas MDA. The peripheral area PA that is a non-display area may be an area where the pixel PX is not located. For example, the organic light-emitting diode OLED and/or the pixel circuit PC may not be located in the peripheral area PA, or even when the organic light-emitting diode OLED is located in the peripheral area PA, the organic light-emitting diode OLED may not be electrically connected to the pixel circuit PC. The peripheral area PA may at least partially surround the display area DA.

Drivers for applying an electrical signal to the pixel circuit PC through signal wirings may be located in the peripheral area PA. For example, a scan driver DR that applies a scan signal to each pixel circuit PC through the scan line SL. Also, a data driver (not shown) for applying a data signal to the pixel circuit PC through the data line DL and a power supply wiring (not shown) for supplying a power supply voltage to the pixel circuit PC may be located in the peripheral area PA. The data driver (not shown) may be located adjacent to a side of the display panel 10, or may be located on a flexible printed circuit board ("FPCB") electrically connected to a pad (not shown) located on a side of the display panel 10.

As described with reference to FIG. 1, each of the corner portions CN of the display panel 10 may have a curved surface that connects curved surfaces bent in multiple directions. In order to form the corner portions CN, a portion of the substrate 100 may be contracted and another portion of the substrate 100 may be stretched. In general, after elements such as the pixel circuit PC and the organic light-emitting diode OLED are formed on the substrate 100, the substrate 100 may be bent. In this case, because elements located at the corner portions CN have to be both contracted and stretched, it may be difficult to form the pixels PX on the corner portions CN. For this reason, in a display apparatus of a comparative example, pixels may be formed on portions other than corner portions, and thus the corner portions become non-display areas.

However, according to embodiments, elements located at the corner portions CN may be located without damage due to contraction and stretching, and thus the corner display area CDA may be formed by forming the pixels PX even on the corner portions CN. Accordingly, a non-display area of the display panel 10 may be reduced, and a display area DA may be extended, which will be described below in detail.

Figure 5A:
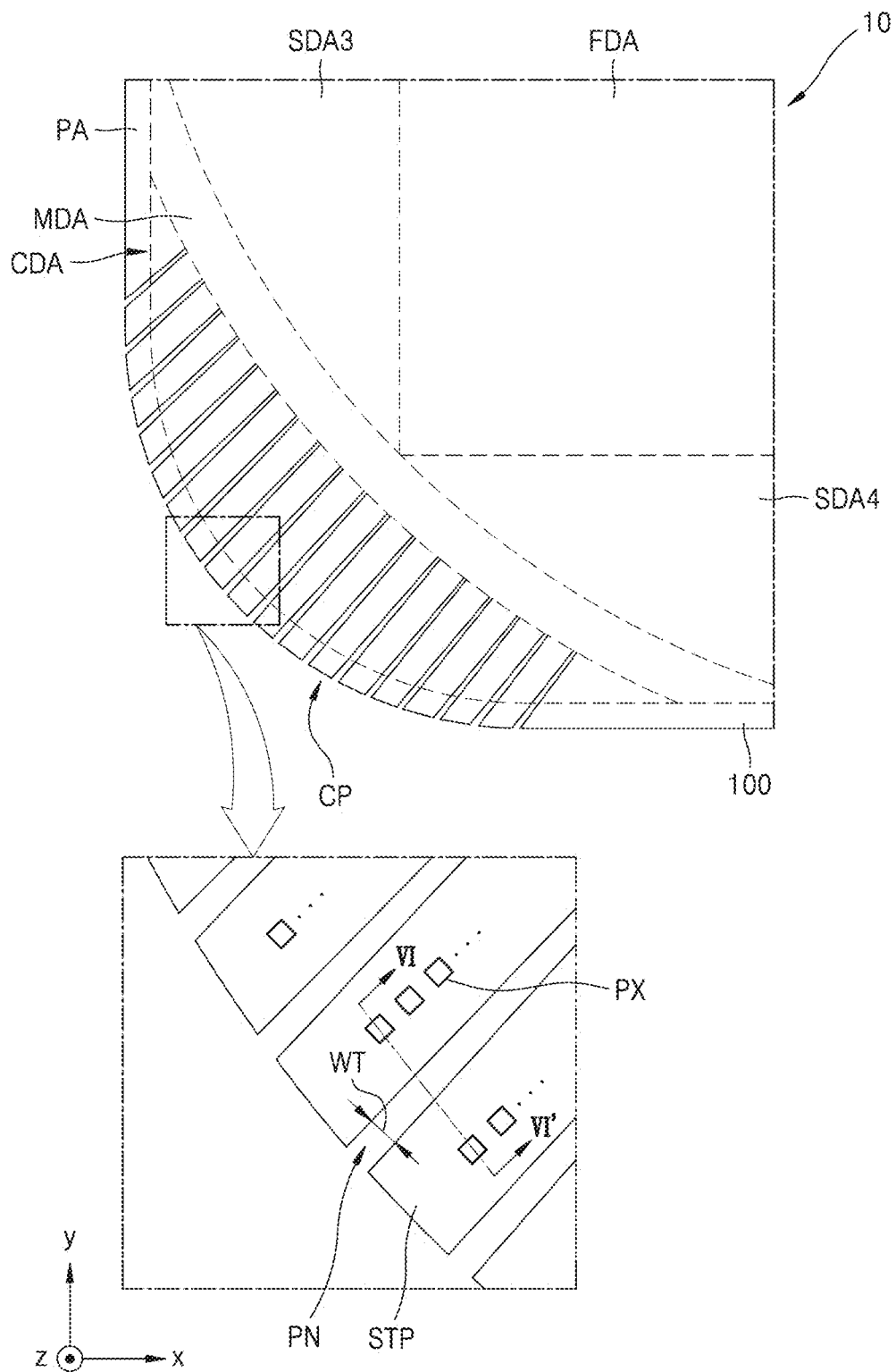
FIGS. 5A and 5B are partially enlarged plan views illustrating a portion of a display panel according to an embodiment.
Figure 5B:
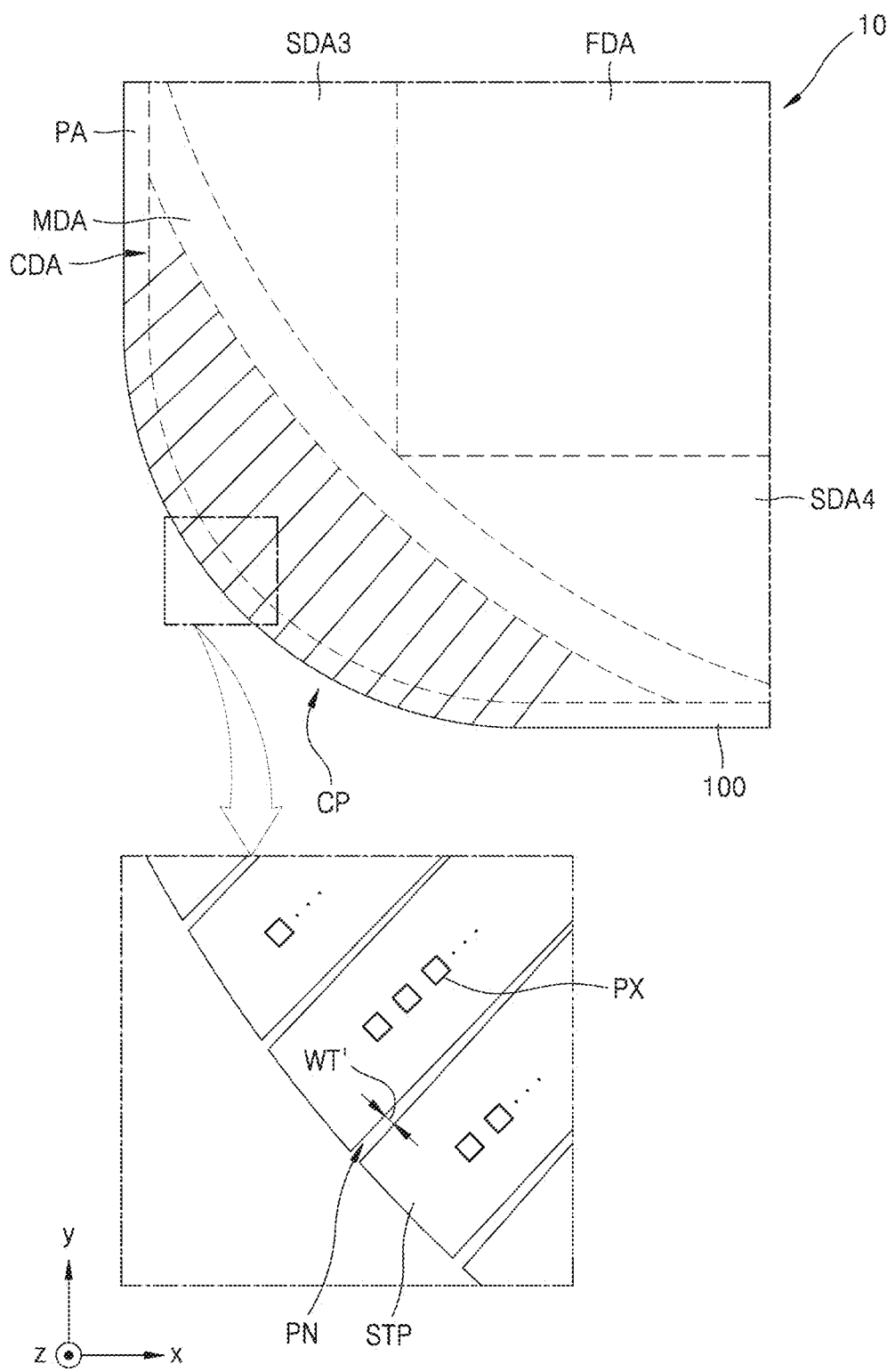

FIGS. 5A and 5B are partially enlarged plan views illustrating a portion of a display panel according to an embodiment. FIGS. 5A and 5B may correspond to a corner portion of FIG. 4. FIG. 5A may correspond to a state before an external force is applied to a display panel, and FIG. 5B may correspond to a state where an external force is applied to a display panel and deformation occurs.

Referring to FIG. 5A, the substrate 100 of the display panel 10 may include a plurality of strip portions STP located at a corner. The plurality of strip portions STP may longitudinally extend in a direction from the center of the substrate 100 toward the corner of the substrate 100 (i.e., longitudinal direction). A length of the plurality of strip portions STP in the longitudinal direction may be greater than a width in a direction intersecting the longitudinal direction. First ends of the plurality of strip portions STP may be connected to a portion of the substrate 100, and the other ends (i.e., second ends) of the plurality of strip portions STP may form the corner of the substrate 100.

A through-portion PN may be located between two adjacent strip portions STP. The through-portion PN may be a gap (i.e., empty space) between the two adjacent strip portions STP, and may be defined by the two adjacent strip portions STP. The through-portion PN may extend in a direction between the longitudinal directions of the two adjacent strip portions STP. The through-portion PN may pass through a top surface and a bottom surface of the display panel 10, and may reduce a weight of the display panel 10.

The plurality of strip portions STP may be arranged parallel to one another, or may be radially arranged. In an embodiment, when the plurality of strip portions STP is arranged parallel to one another, a width WT of the through-portion PN defined between the two adjacent strip portions STP may be constant in the longitudinal direction of the through-portion PN. In another embodiment, when the plurality of strip portions STP is radially arranged, the width WT of the through-portion PN defined between the two adjacent strip portions STP may gradually increase in the longitudinal direction of the through-portion PN. For convenience of explanation, the following will be described assuming that the plurality of strip portions STP is radially arranged as shown in FIG. 5A. Here, the width WT of the through-portion PN is defined as a distance between the two adjacent strip portions STP defining the through-portion PN as shown in FIG. 5A.

Elements such as a pixel circuit, an organic light-emitting diode, and a signal wiring may be located on the plurality of strip portions STP, to form the plurality of pixels PX. The corner display area CDA may be implemented by the pixels PX on the plurality of strip portions STP.

Referring to FIG. 5B, when an external force (e.g., a bending force or a compressive force) is applied to the display panel 10, positions of the plurality of strip portions STP may be changed, and a shape of a gap between two adjacent strip portions STP may be changed. For example, when a bending force for bending a side surface and a corner of the substrate 100 of the display panel 10 is applied, an interval between two adjacent strip portions STP may be reduced, and an area of the gap (i.e., through-portion PN) may be reduced. That is, a width WT' and an area of the through-portion PN may be reduced. Finally, the two adjacent strip portions STP may contact each other. Accordingly, the pixels PX located on the adjacent strip portions STP may be close to each other.

When an external force is applied to the display panel 10 to bend a corner of the display panel 10 as described above, a gap between the strip portions STP may be changed but deformation of the strip portions STP may be minimized. Accordingly, because elements located on the strip portions STP, for example, a pixel circuit and an organic light-emitting diode, may be located without damage due to contraction and stretching, the pixels PX on the strip portions STP may be stably formed. Accordingly, the corner display area CDA may be implemented by forming the pixels PX even at the corner portions CN of the display apparatus 1 (see FIG. 1), and thus the display area DA of the display apparatus 1 may be extended.

Figure 6:
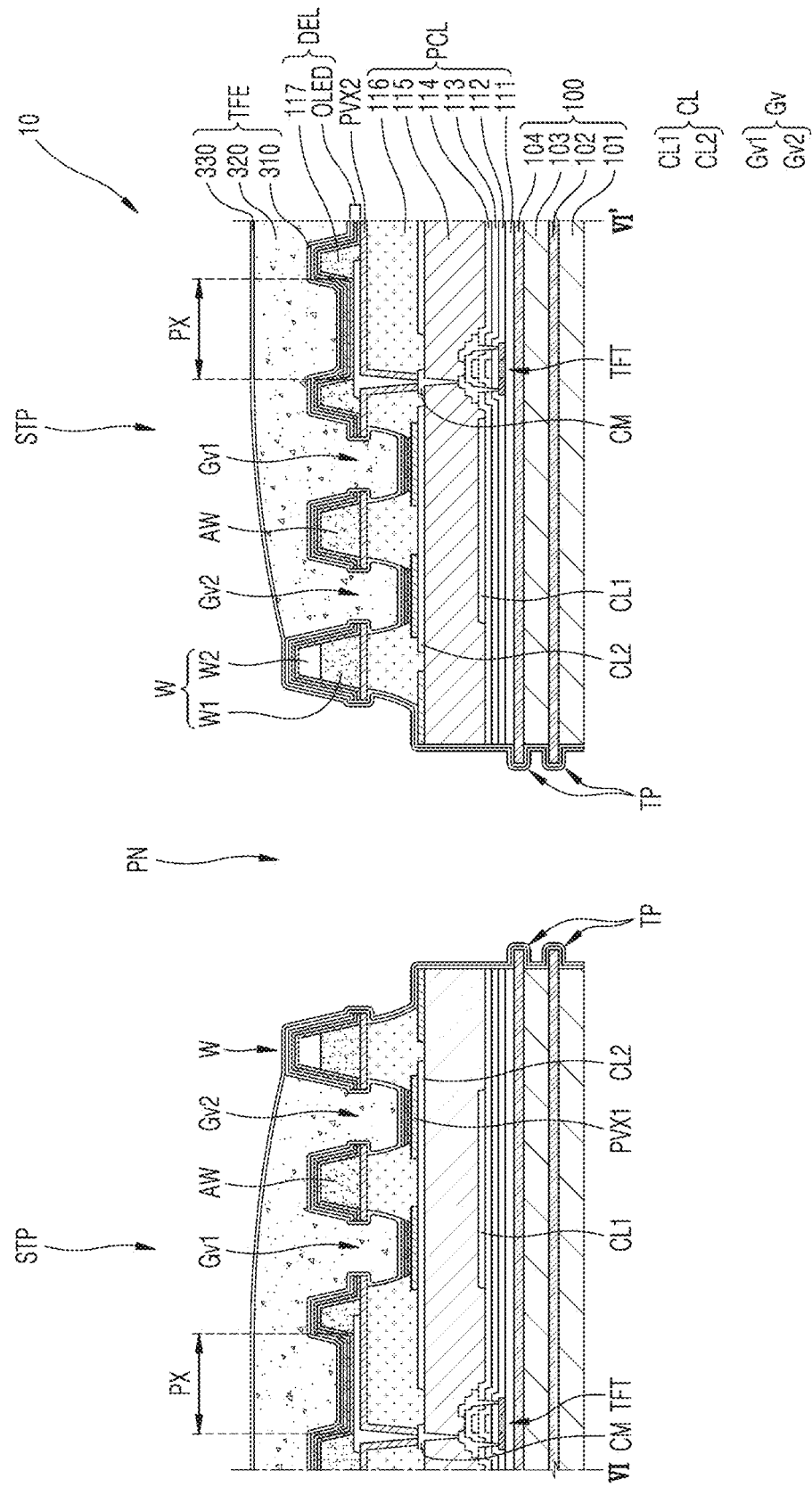
FIG. 6 is a cross-sectional view of a display panel taken along line VI-VI' of FIG. 5A.

FIG. 6 is a cross-sectional view of a display panel taken along line VI-VI' of FIG. 5A. In FIG. 6, the same or corresponding elements as those in FIG. 2 are denoted by the same reference numerals, and thus a repeated description thereof will be omitted.

Referring to FIG. 6, the strip portion STP of the display panel 10 may have a stacked structure of the substrate 100, the pixel circuit layer PCL, the display element layer DEL, and the thin-film encapsulation layer TFE. Two adjacent strip portions STP may be spaced apart from each other with the through-portion PN therebetween.

The first barrier layer 102 and/or the second barrier layer 104 of the substrate 100 may include a tip TP protruding from a side surface of the first base layer 101 and/or the second base layer 103 toward the through-portion PN.

A first connection wiring CL1 may be located on the interlayer insulating layer 114, and may be covered by the first planarization insulating layer 115. A second connection wiring CL2 may be located on the first planarization insulating layer 115, and at least a part of the second connection wiring CL2 may be covered by the second planarization insulating layer 116. The first connection wiring CL1 and the second connection wiring CL2 may extend from the intermediate display area MDA (see FIG. 4) toward the corner display area CDA (see FIG. 4). Each of the first connection wiring CL1 and the second connection wiring CL2 may be a signal wiring for applying an electrical signal to a pixel circuit located on the strip portion STP or a power supply wiring for supplying power.

The strip portion STP may define a groove Gv that is formed by removing a part of the second planarization insulating layer 116 and is concave in a thickness direction. A depth of the groove Gv in a third direction (e.g., an z-direction) may be substantially the same as a thickness of the second planarization insulating layer 116. The groove Gv may be located outside the pixel PX of the strip portion STP. That is, the groove Gv may be located between the pixel PX of the strip portion STP and the through-portion PN in a plan view. A plurality of grooves Gv may be provided in the strip portion STP, and may include a first groove Gv1 and a second groove Gv2.

The strip portion STP may include a first passivation layer PVX1 covering the second connection wiring CL2 so that the second connection wiring CL2 is not exposed through the groove Gv. The first passivation layer PVX1 may include an inorganic insulating material such as silicon nitride, silicon oxide, or silicon oxynitride. An edge of the first passivation layer PVX1 may be covered by the second planarization insulating layer 116.

The strip portion STP may include a second passivation layer PVX2 located on the second planarization insulating layer 116. The second passivation layer PVX2 may include a portion protruding beyond a side surface of the second planarization insulating layer 116 that defines the groove Gv. The protruding portion of the second passivation layer PVX2 may form an overhang structure (e.g., an eave structure or an undercut structure).

A common layer of the organic light-emitting diode OLED, for example, the first functional layer 221 (see FIG. 2) and the second functional layer 223 (see FIG. 2) of the intermediate layer 220 (see FIG. 2) and/or the common electrode 230 (see FIG. 2), formed on the second planarization insulating layer 116 may be disconnected by the overhang structure of the second passivation layer PVX2. The overhang structure may be formed before the intermediate layer 220 is formed, and the common layer of the organic light-emitting diode OLED that is integrally formed to cover the plurality of pixels PX may be disconnected or separated around the protruding portion that forms the overhang structure. Accordingly, a part of the common layer of the organic light-emitting diode OLED may remain on a bottom surface of the groove Gv, for example, on the first passivation layer PVX1.

The strip portion STP may include a partition wall portion W and an auxiliary partition wall portion AW located on the second passivation layer PVX2. The partition wall portion W and the auxiliary partition wall portion AW may be located between the pixel PX and the through-portion PN, and may be alternately arranged with the first groove Gv1 and the second groove Gv2. For example, the first groove Gv1, the auxiliary partition wall portion AW, the second groove Gv2, and the partition wall portion W may be sequentially arranged in a direction from the pixel PX to the through-portion PN. In a plan view, the partition wall portion W and the auxiliary partition wall portion AW may entirely or partially surround the pixels PX provided on the strip portion STP.

The partition wall portion W may include a first layer W1 and a second layer W2 on the first layer W1. The first layer W1 may include the same material as that of the pixel-defining film 117, and may be formed by using the same process. The second layer W2 may include an organic insulating material, and for example, may be formed by using a process different from that of the first layer W1. As another example, the second layer W2 may include the same material as that of the first layer W1, and in this case, the first layer W1 and the second layer W2 may be formed together by using a halftone mask. The auxiliary partition wall portion AW may be provided as one layer, and may include the same material as that of the pixel-defining film 117.

The partition wall portion W and the auxiliary partition wall portion AW may function as a dam DAM for the organic encapsulation layer 320. In an embodiment, the organic encapsulation layer 320 may be formed by applying a monomer to the substrate 100 and then curing the monomer. In this case, in order to prevent the monomer from overflowing to a region other than a desired region, the flow of the monomer may be controlled through the partition wall portion W and the auxiliary partition wall portion AW, and a thickness of the monomer, that is, a thickness of the organic encapsulation layer 320, may be adjusted. As a result of controlling the flow of the monomer, an end of the organic encapsulation layer 320 may be located on a side of the partition wall portion W, or may be located on a side of the auxiliary partition wall portion AW.

A method of manufacturing the display panel 10 will now be described in detail.

Figure 7A:
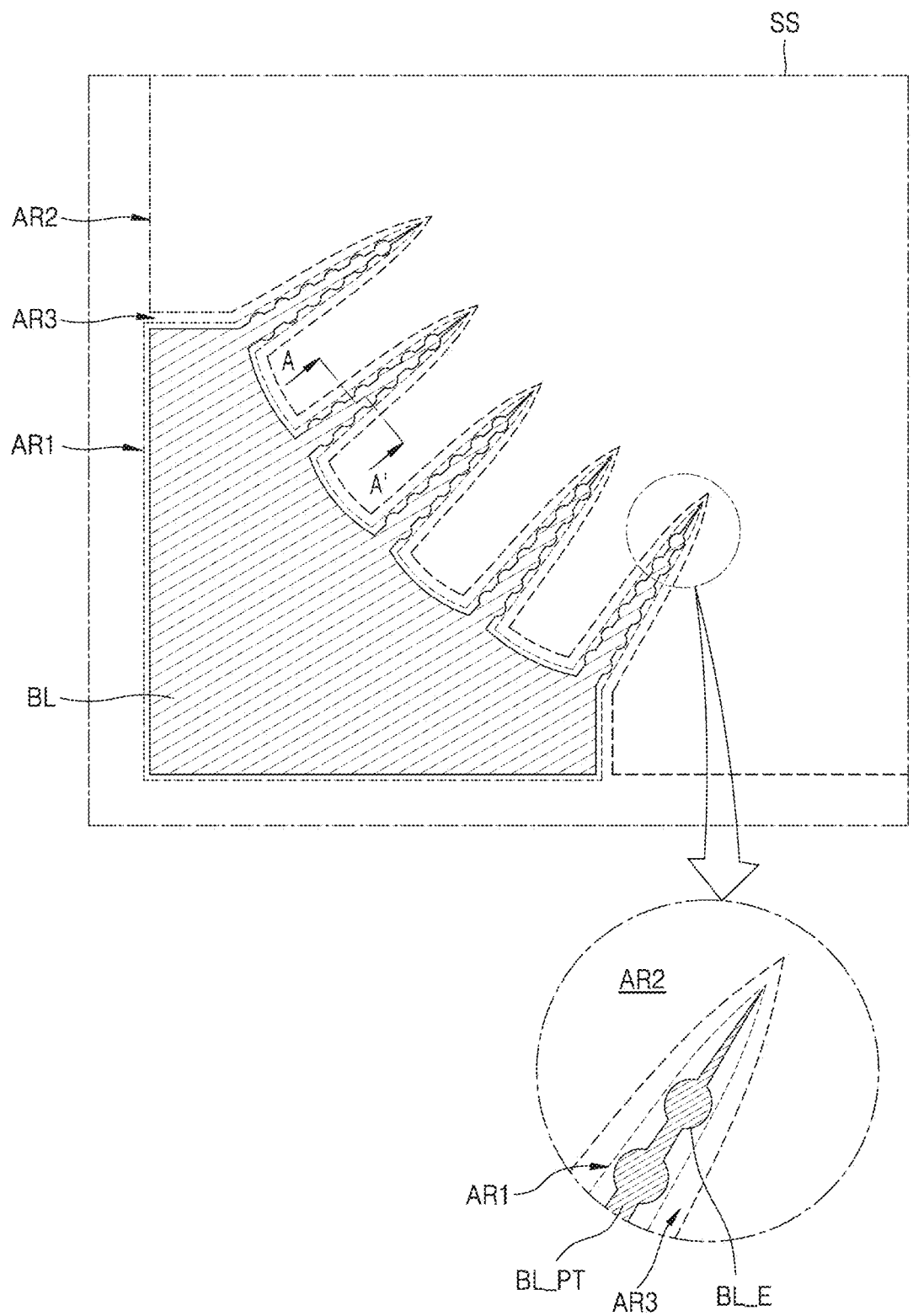

FIGS. 7A and 7B are a plan view and a cross-sectional view, respectively, illustrating some operations of a method of manufacturing a display panel, according to an embodiment. FIG. 7B is a cross-sectional view taken along line A-A' of FIG. 7A.

Referring to FIGS. 7A and 7B, a support substrate SS including first to third areas AR1 to AR3 may be prepared. Here, the first area AR1 and a second area AR2 are spaced apart from each other, and a third area AR3 is disposed between the first and second areas AR1 and AR2. The support substrate SS may have a first surface S1 and a second surface S2 that is opposite to the first surface S1. The first surface S1 may be referred to as a top surface of the support substrate SS, and the second surface S2 may be referred to as a bottom surface of the support substrate SS. The support substrate SS may be formed of a material, for example, a glass material, having hardness and rigidity high enough to support the display panel 10 to be manufactured.

A blocking layer BL may be formed on the first surface S1 of the support substrate SS. The blocking layer BL may be patterned to have a specific shape, as shown in FIG. 7A. In an embodiment, the blocking layer BL may include a plurality of protrusions BL_PT arranged to be spaced apart from one another, and an edge BL_E of each of the plurality of protrusions BL_PT may include an uneven portion including a convex portion and a concave portion. However, the shape is merely an example, and a shape of the blocking layer BL may be freely changed.

The first area AR1 of the support substrate SS may be defined as an area where the blocking layer BL is located, and an area where the blocking layer BL is not located may include the second area AR2 and the third area AR3. According to embodiments, when a process of manufacturing the display panel 10 is performed, various materials may be stacked and formed in the first through third areas AR1, AR2, and AR3 of the support substrate SS. In this case, materials stacked in the first area AR1 where the blocking layer BL is located may be removed without being provided on the display panel 10 after a final process. In contrast, materials stacked in the second area AR2 of the area where the blocking layer BL is not located may constitute the display panel 10. That is, the second area AR2 may be an area overlapping the display panel 10 that is manufactured according to embodiments, and the first area AR1 and the third area AR3 may be areas not overlapping the display panel 10 that is manufactured.

The blocking layer BL may include a material capable of blocking a laser used in a step of separating the substrate 100 of the display panel 10 from the support substrate SS (which will be described below). In an embodiment, the blocking layer BL may include a material having an absorptance of 90 percentages (%) or more (or a transmittance of 10% or less) in a wavelength band of about 300 nanometers (nm). For example, the blocking layer BL may include at least one of amorphous silicon (a-Si), polysilicon (Poly-Si), crystalline-Si, ZnO, and IZO. In an embodiment, when an excimer laser having a wavelength of 308 nm is used, it is preferable to use amorphous silicon (a-Si) in a wavelength of 308 nm.

A photolithography process may be used to form the blocking layer BL. In detail, the blocking layer BL may be formed by applying a material for forming the blocking layer BL to the support substrate SS, and then performing patterning through exposure and development using a photoresist.

Figure 8A:
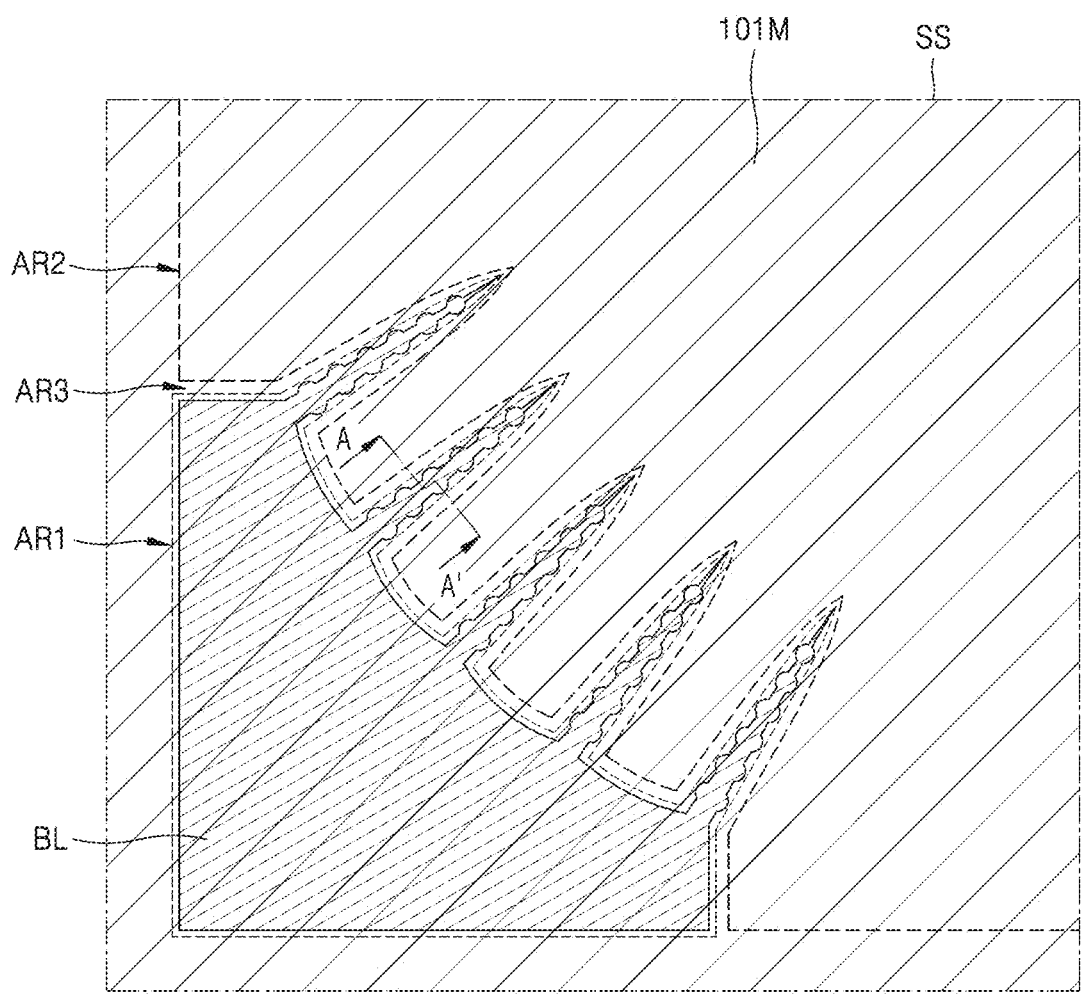
FIGS. 8A and 8B are a plan view and a cross-sectional view, respectively, illustrating some operations of a method of manufacturing a display panel, according to an embodiment.
Figure 8B:
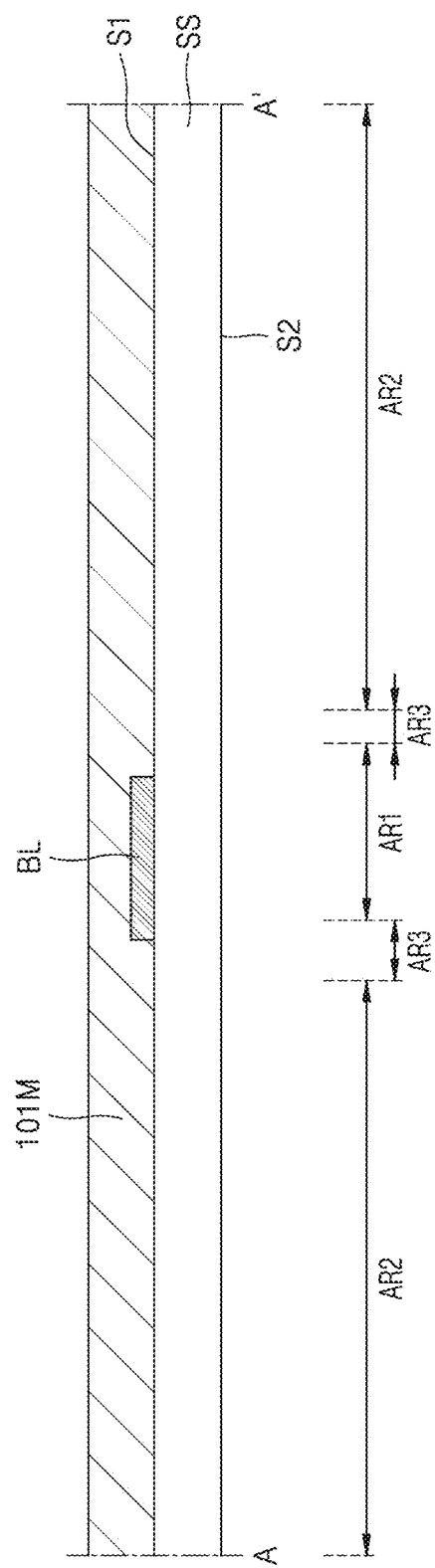

FIGS. 8A and 8B are a plan view and a cross-sectional view, respectively, illustrating some operations of a method of manufacturing a display panel, according to an embodiment. FIG. 8B is a cross-sectional view taken along line A-A' of FIG. 8A. FIG. 8B illustrates an operation next to an operation of FIG. 7B.

Referring to FIGS. 8A and 8B, a first organic material layer 101M may be formed on the support substrate SS. The first organic material layer 101M may cover the blocking layer BL, and may be formed to be located over the entirety of the first through third areas AR1, AR2, and AR3. The first organic material layer 101M may be formed by using, for example, screen printing, inkjet printing, or deposition.

Figure 9A:
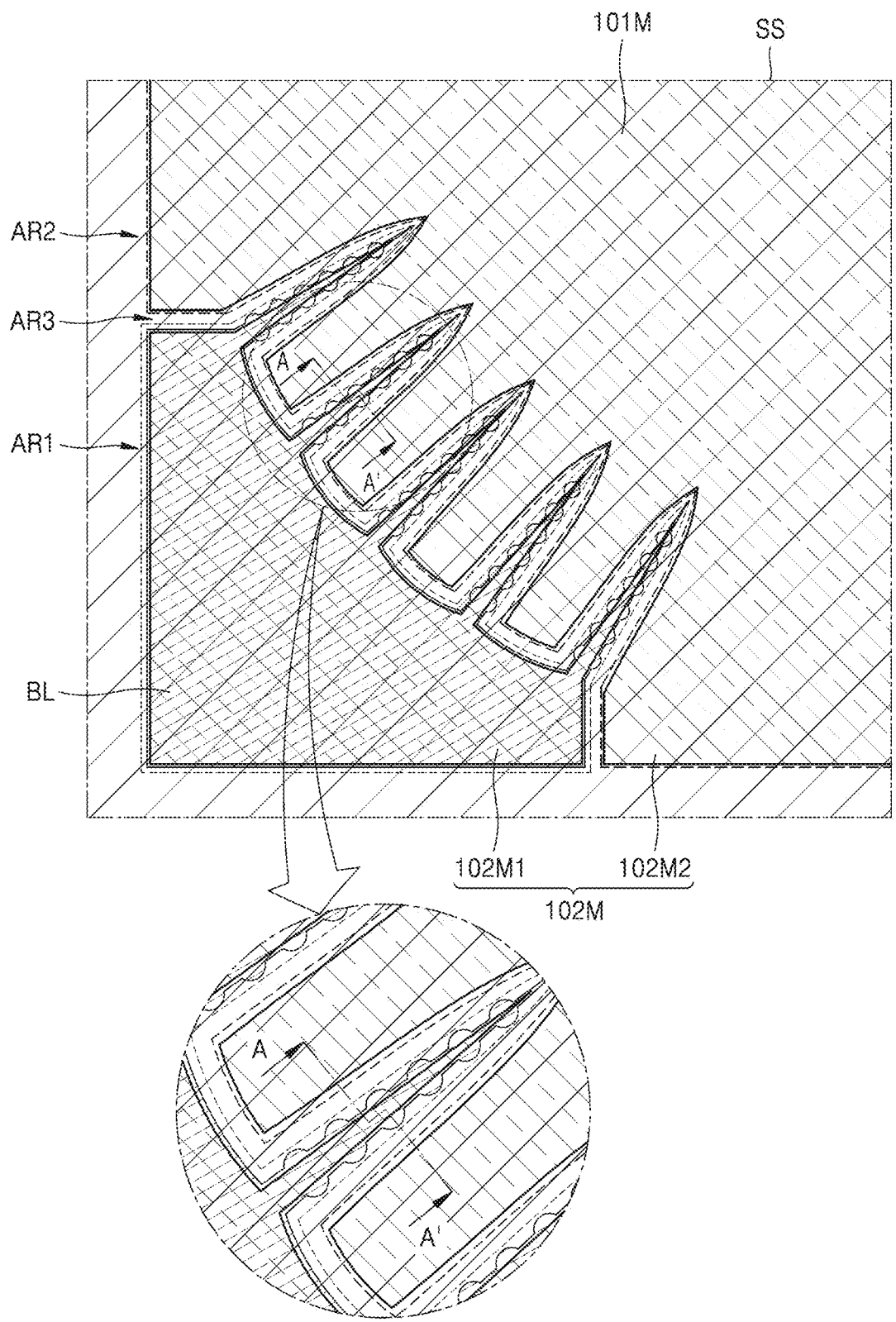
FIGS. 9A and 9B are respectively a plan view and a cross-sectional view illustrating some operations of a method of manufacturing a display panel, according to an embodiment.
Figure 9B:
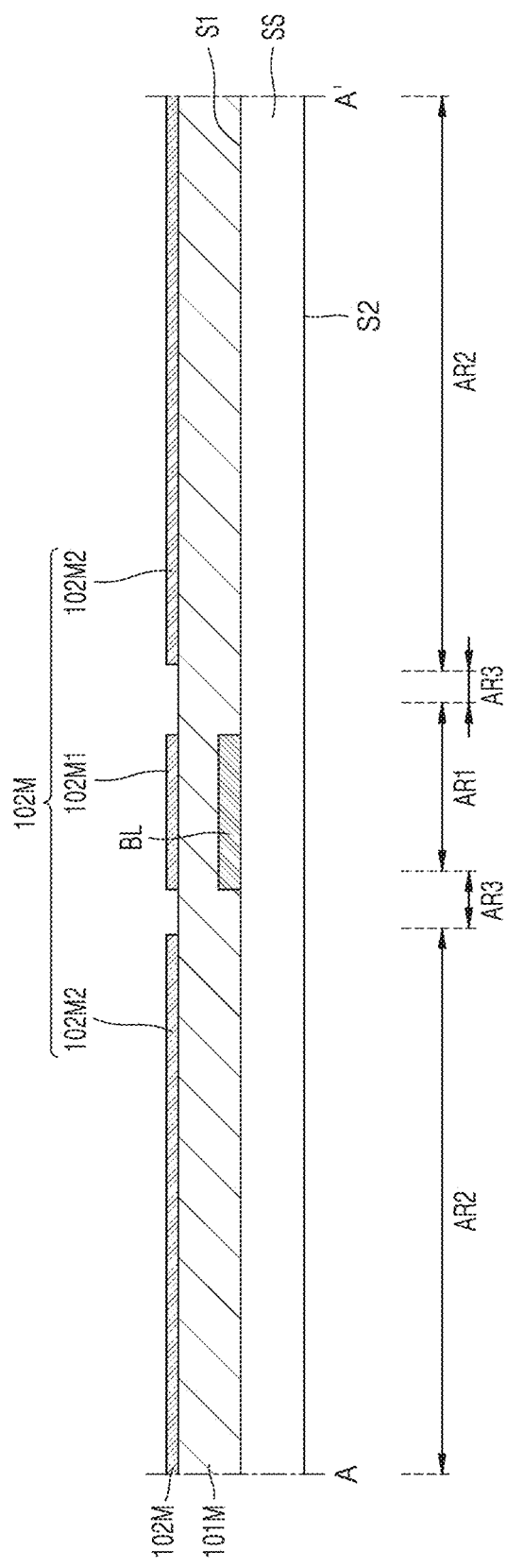

FIGS. 9A and 9B are a plan view and a cross-sectional view, respectively, illustrating some operations of a method of manufacturing a display panel, according to an embodiment. FIG. 9B is a cross-sectional view taken along line A-A' of FIG. 9A. FIG. 9B illustrates an operation next to an operation of FIG. 8B.

Referring to FIGS. 9A and 9B, a first inorganic material layer 102M may further be formed on the first organic material layer 101M. In an embodiment, the first inorganic material layer 102M may include a $1\text{-}1^{th}$ inorganic material layer 102M1 corresponding to the first area AR1, and a $1\text{-}2^{th}$ inorganic material layer 102M2 corresponding to the second area AR2. That is, the first inorganic material layer 102M may be located only in the first area AR1 and the second area AR2, and may not be located in the third area AR3. In another embodiment, the first inorganic material layer 102M may be formed only in the second area AR2, and may not be formed in the first area AR1 and the third area AR3. For convenience of explanation, the following will be described assuming that the $1\text{-}1^{th}$ inorganic material layer 102M1 corresponding to the first area AR1 and the $1\text{-}2^{th}$ inorganic material layer 102M2 corresponding to the second area AR2 are formed. The first inorganic material layer 102M may be formed by using, for example, screen printing, inkjet printing, or deposition.

Figure 10:
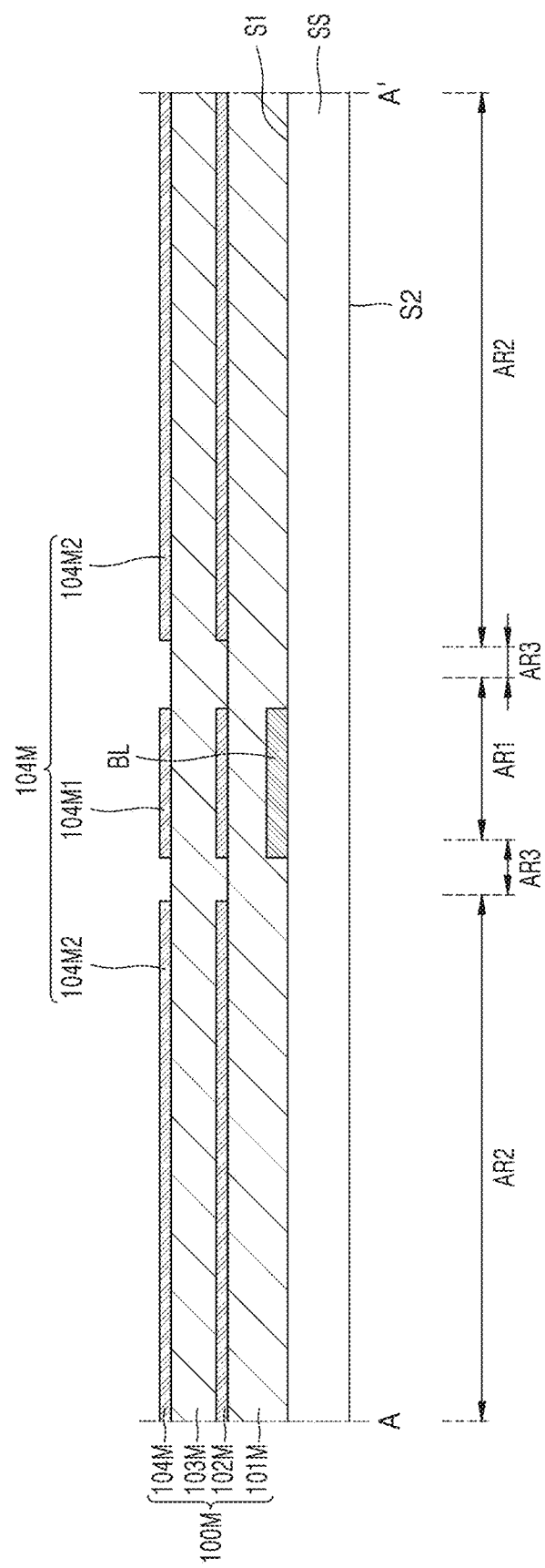
FIG. 10 is a cross-sectional view illustrating some operations of a method of manufacturing a display panel, according to an embodiment.

FIG. 10 is a cross-sectional view illustrating some operations of a method of manufacturing a display panel, according to an embodiment. FIG. 10 illustrates an operation next to an operation of FIG. 9B.

Referring to FIG. 10, a second organic material layer 103M may be formed on the first inorganic material layer 102M. The second organic material layer 103M may be formed to be located over the entirety of the first through third areas AR1, AR2, and AR3, like the first organic material layer 101M. The second organic material layer 103M may cover the first inorganic material layer 102M.

Next, a second inorganic material layer 104M may be formed on the second organic material layer 103M. The second inorganic material layer 104M may correspond to the first inorganic material layer 102M. That is, the second inorganic material layer 104M may include a $2\text{-}1^{th}$ inorganic material layer 104M1 corresponding to the first area AR1 and a $2\text{-}2^{th}$ inorganic material layer 104M2 corresponding to the second area AR2. That is, the second inorganic material layer 104M may be located only in the first area AR1 and the second area AR2, and may not be located in the third area AR3.

A stacked structure of the first organic material layer 101M, the first inorganic material layer 102M, the second organic material layer 103M, and the second inorganic material layer 104M may be collectively referred to as a substrate material layer 100M. After the substrate material layer 100M undergoes a subsequent process, the substrate 100 (see FIG. 6) of the display panel 10 (see FIG. 6) and a dummy substrate 100DM (see FIG. 12A) not provided on the display panel 10 may be formed.

Figure 11:
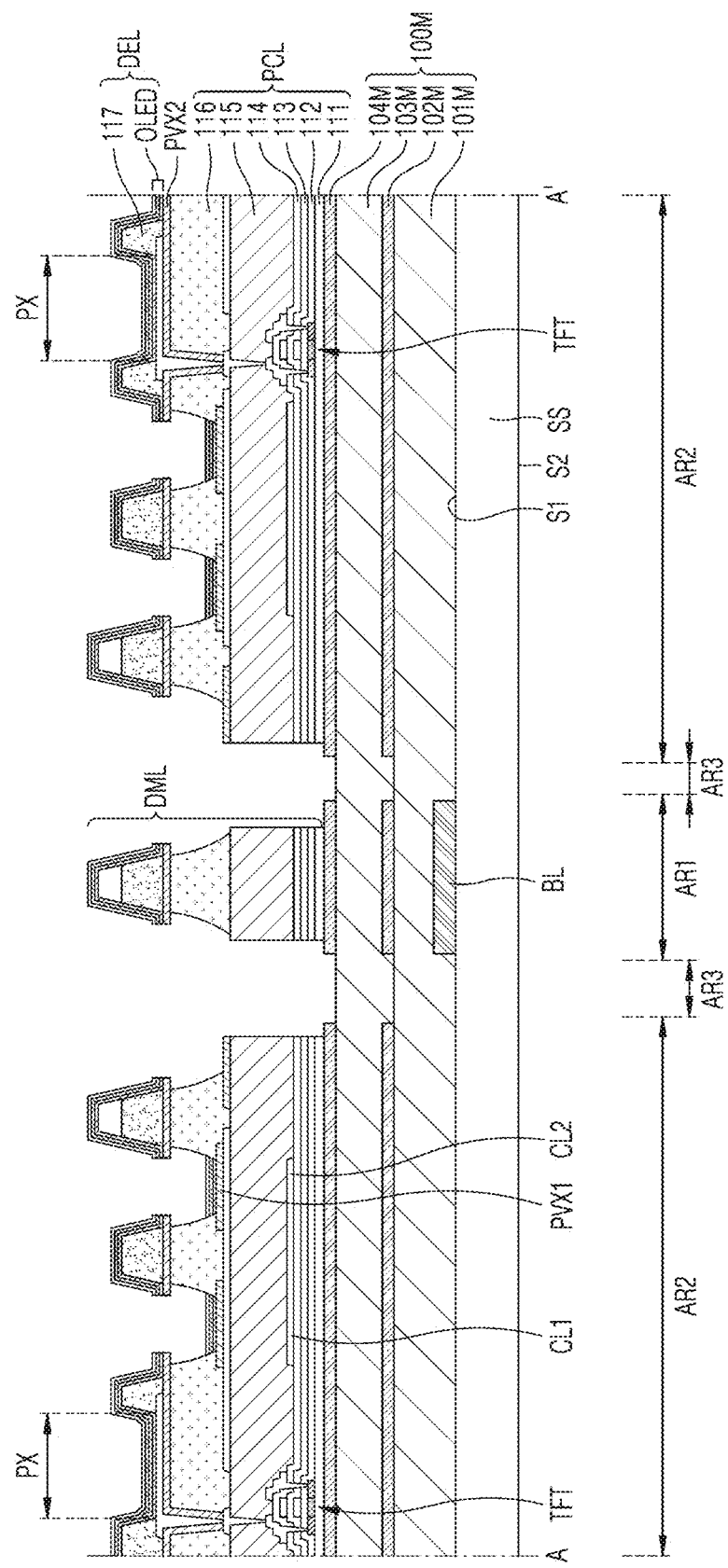
FIG. 11 is a cross-sectional view illustrating some operations of a method of manufacturing a display panel, according to an embodiment.

FIG. 11 is a cross-sectional view illustrating some operations of a method of manufacturing a display panel, according to an embodiment. FIG. 11 illustrates an operation next to an operation of FIG. 10. The same or corresponding elements as those in FIGS. 2 and 6 are denoted by the same reference numerals, and thus a repeated description thereof will be omitted.

Referring to FIG. 11, the pixel circuit layer PCL and the display element layer DEL may be formed in the second area AR2 on the substrate material layer 100M. The pixel circuit layer PCL may include the thin-film transistor TFT and insulating layers located over/under the thin-film transistor TFT. The display element layer DEL may include the organic light-emitting diode OLED and the pixel-defining film 117.

Dummy layers DML may be formed in the first area AR1 on the substrate material layer 100M. The dummy layers DML is to be removed. Therefore, the dummy layers DML does not constitute the display panel 10. The dummy layers DML may include at least one inorganic layer and at least one organic layer. In FIG. 11, the dummy layers DML include a dummy buffer layer, a dummy first gate insulating layer, a dummy second gate insulating layer, a dummy interlayer insulating layer, a dummy first planarization insulating layer, a dummy second planarization insulating layer, a dummy pixel-defining layer, a dummy spacer, a dummy first functional layer, a dummy second functional layer, and a dummy common electrode that are sequentially stacked. The dummy layers DML may be remaining portions without being completely removed in a process of forming the pixel circuit layer PCL and the display element layer DEL in the first area AR1.

Figure 12A:
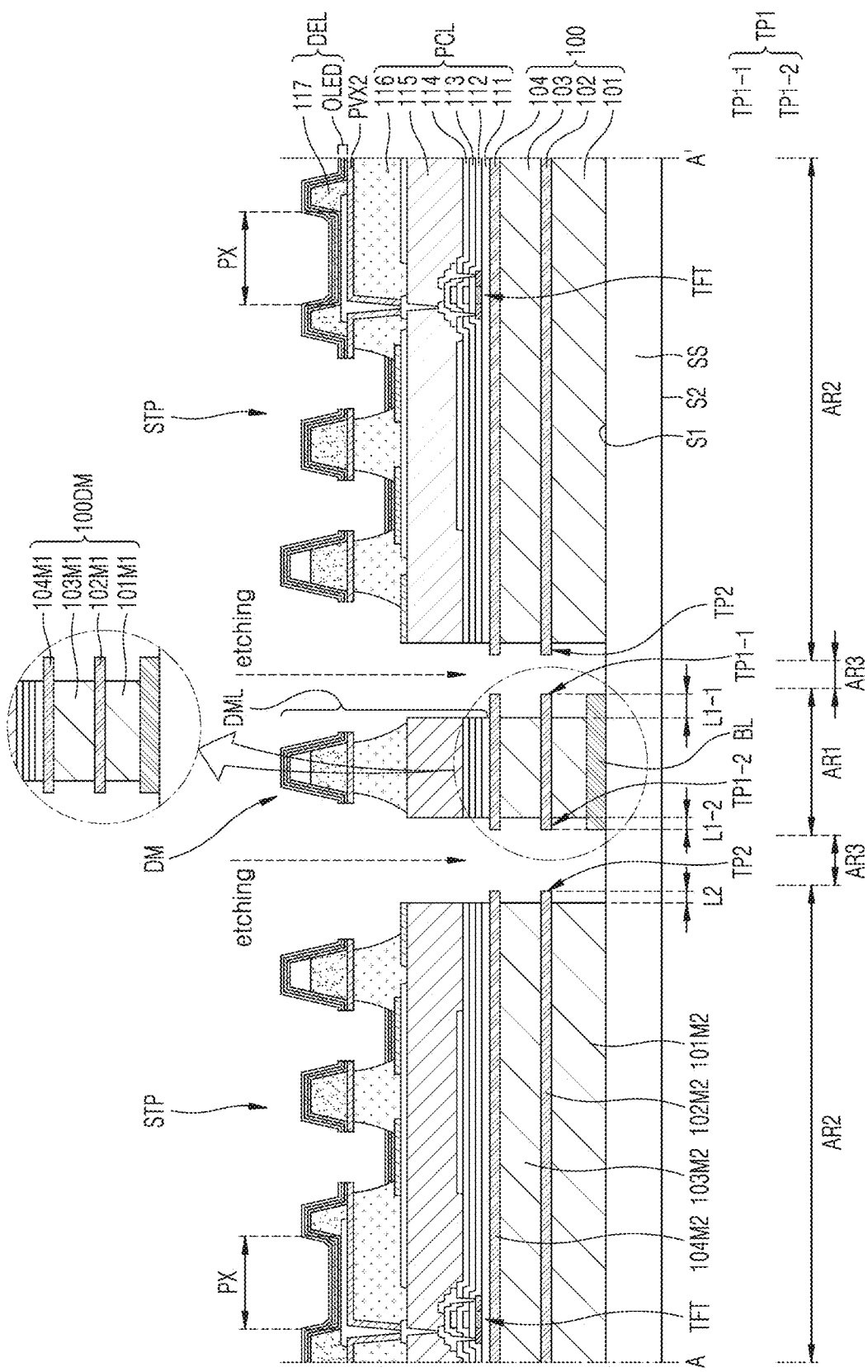
FIG. 12A is a cross-sectional view illustrating some operations of a method of manufacturing a display panel, according to an embodiment.
Figure 12B:
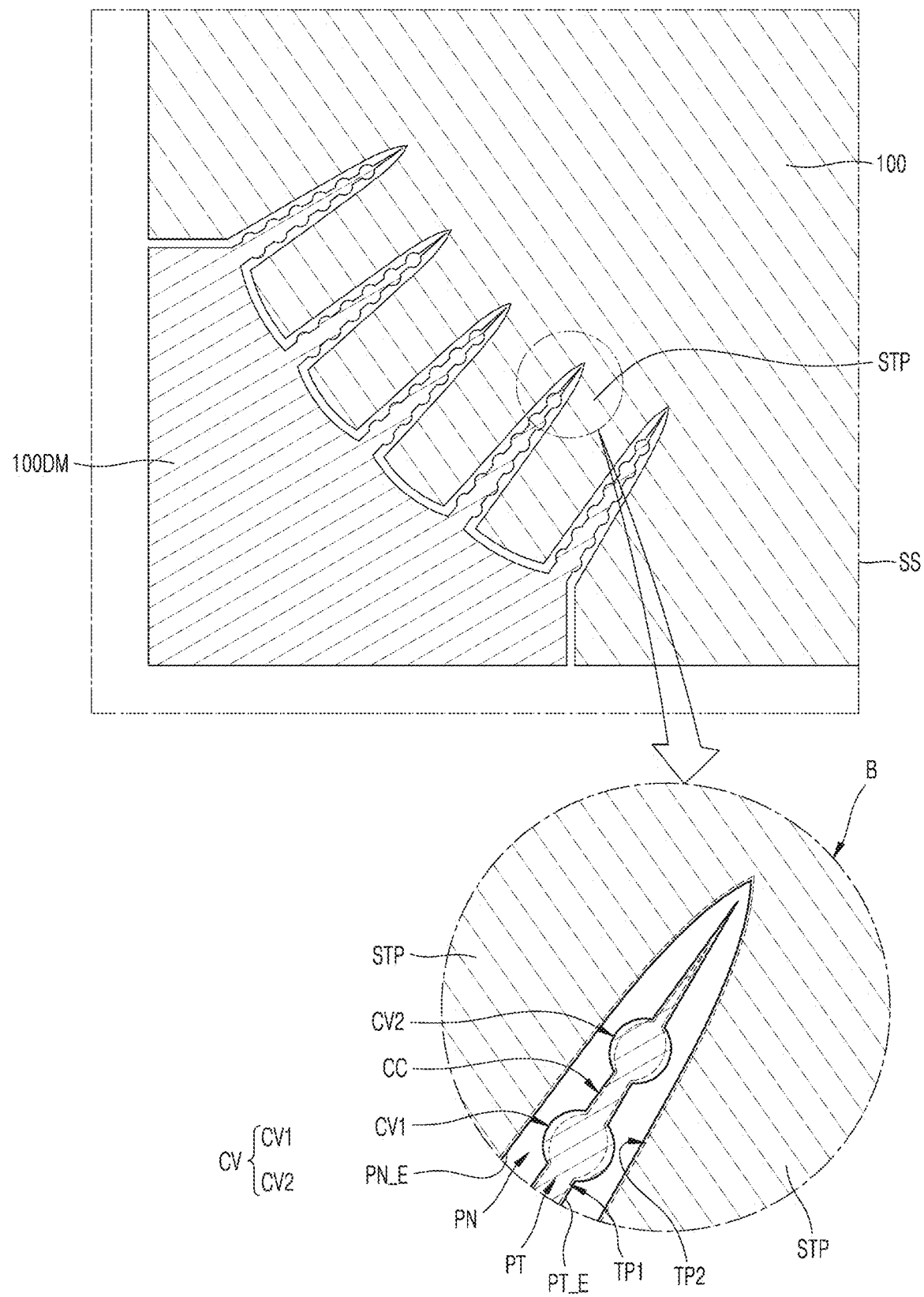
FIG. 12B is a plan view illustrating an arrangement of a dummy substrate of a support substrate and a substrate in an operation of FIG. 12A.
Figure 12C:
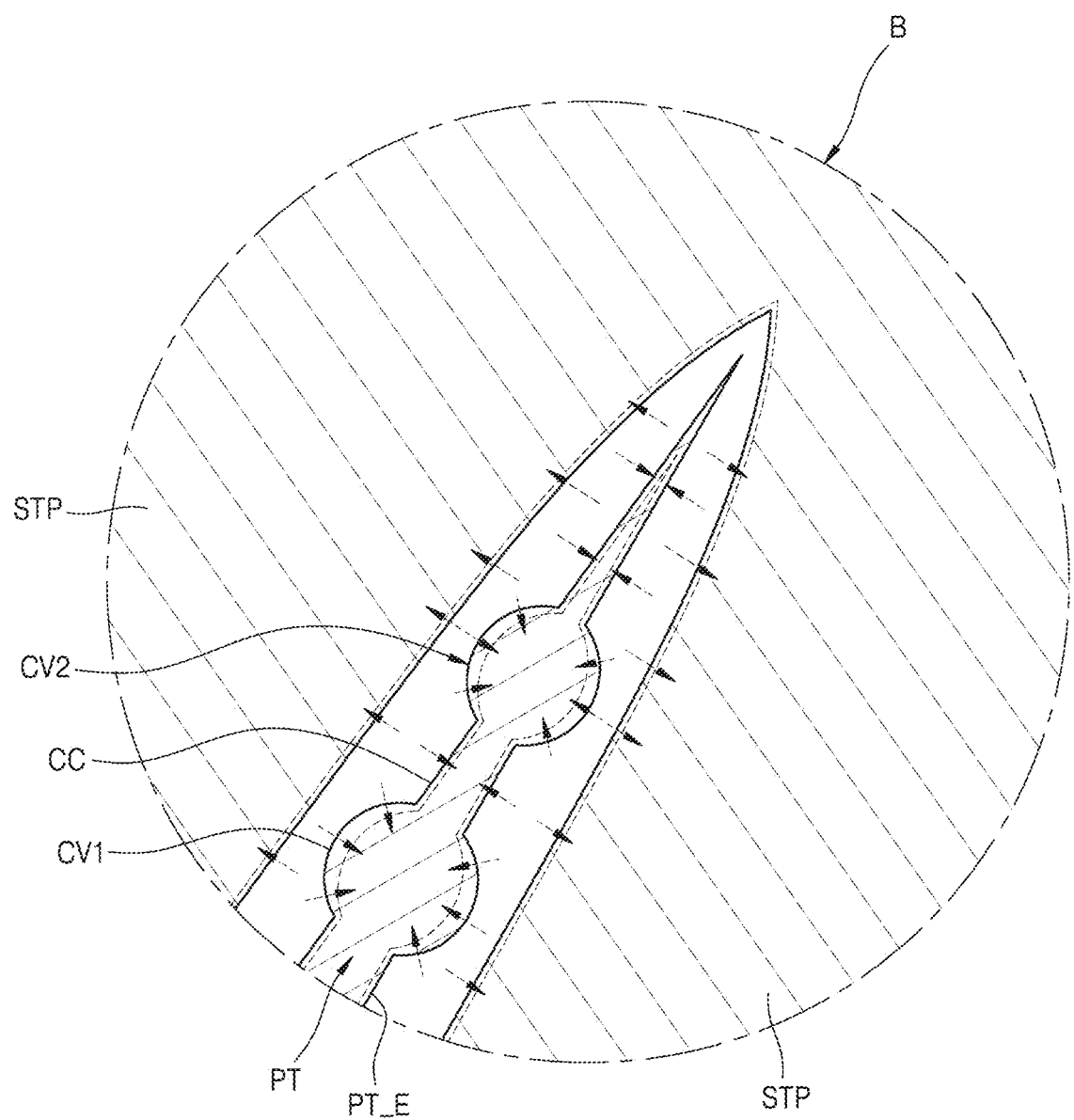
FIG. 12C is an enlarged plan view illustrating a portion B of FIG. 12B.

FIG. 12A is a cross-sectional view illustrating some operations of a method of manufacturing a display panel, according to an embodiment. FIG. 12B is a plan view illustrating an arrangement of a dummy substrate of a support substrate and a substrate in an operation of FIG. 12A. FIG. 12C is an enlarged plan view illustrating a portion B of FIG. 12B. FIGS. 12A through 12C illustrate operations after an operation of FIG. 11. In FIGS. 12B and 12C, a stacked structure on the dummy substrate 100DM and the substrate 100 is not shown for convenience of explanation. FIGS. 12B and 12C illustrate the dummy substrate 100DM and the substrate 100 seen from above the support substrate SS. After removing the part of the substrate material layer 100M formed in the third area AR3 by etching, the part of the substrate material layer 100M remained in the second area AR2 is referred as the substrate 100, and the part of the substrate material layer 100M remained in the first area AR1 is referred as the dummy substrate 100DM, as explained below.

Referring to FIG. 12A, a portion of the substrate material layer 100M corresponding to the third area AR3 may be removed. In detail, portions of the first organic material layer 101M and the second organic material layer 103M of the substrate material layer 100M corresponding to the third area AR3 may be removed by using etching. The etching may be wet etching or dry etching. Because the first inorganic material layer 102M exposes a portion of the first organic material layer 101M, which is under the first inorganic material layer 102M and corresponds to the third area AR3, and the second inorganic material layer 104M exposes a portion of the second organic material layer 103M, which is under the second inorganic material layer 104M and corresponds to the third area AR3, an etching solution or an etching gas in an etching process may sequentially remove the corresponding portion of the second organic material layer 103M and the corresponding portion of the first organic material layer 101M.

As a portion of the first organic material layer 101M corresponding to the third area AR3 is removed, a 1-1$^{th}$ organic material layer 101M1 in the first area AR1 and a 1-2$^{th}$ organic material layer 101M2 in the second area AR2 may be formed. As a portion of the first organic material layer 101M in the third area AR3 is etched and removed, the 1-1$^{th}$ organic material layer 101M1 and the 1-2$^{th}$ organic material layer 101M2 may be formed by remaining portions of the first organic material layer 101M.

Likewise, as a portion of the second organic material layer 103M corresponding to the third area AR3 is removed, a 2-1$^{th}$ organic material layer 103M1 in the first area AR1 and a 2-2$^{th}$ organic material layer 103M2 in the second area AR2 may be formed. As a portion of the second organic material layer 103M in the third area AR3 is etched and removed, the 2-1$^{th}$ organic material layer 103M1 and the 2-2$^{th}$ organic material layer 103M2 may be formed by remaining portions of the second organic material layer 103M.

As a portion of the substrate material layer 100M corresponding to the third area AR3 is removed as described above, the dummy substrate 100DM may be formed in the first area AR1 and the substrate 100 may be formed in the second area AR2. The dummy substrate 100DM may have a stacked structure of the 1-1$^{th}$ organic material layer 101M1, the 1-1$^{th}$ inorganic material layer 102M1, the 2-1$^{th}$ organic material layer 103M1, and the 2-1$^{th}$ inorganic material layer 104M1. The substrate 100 may have a stacked structure of the 1-2$^{th}$ organic material layer 101M2, the 1-2$^{th}$ inorganic material layer 102M2, the 2-2$^{th}$ organic material layer 103M2, and the 2-2$^{th}$ inorganic material layer 104M2. The 1-2$^{th}$ organic material layer 101M2, the 1-2$^{th}$ inorganic material layer 102M2, the 2-2$^{th}$ organic material layer 103M2, and the 2-2$^{th}$ inorganic material layer 104M2 may correspond to the first base layer 101, the first barrier layer 102, the second base layer 103, and the second barrier layer 104 of the substrate 100, respectively.

Figure 13:
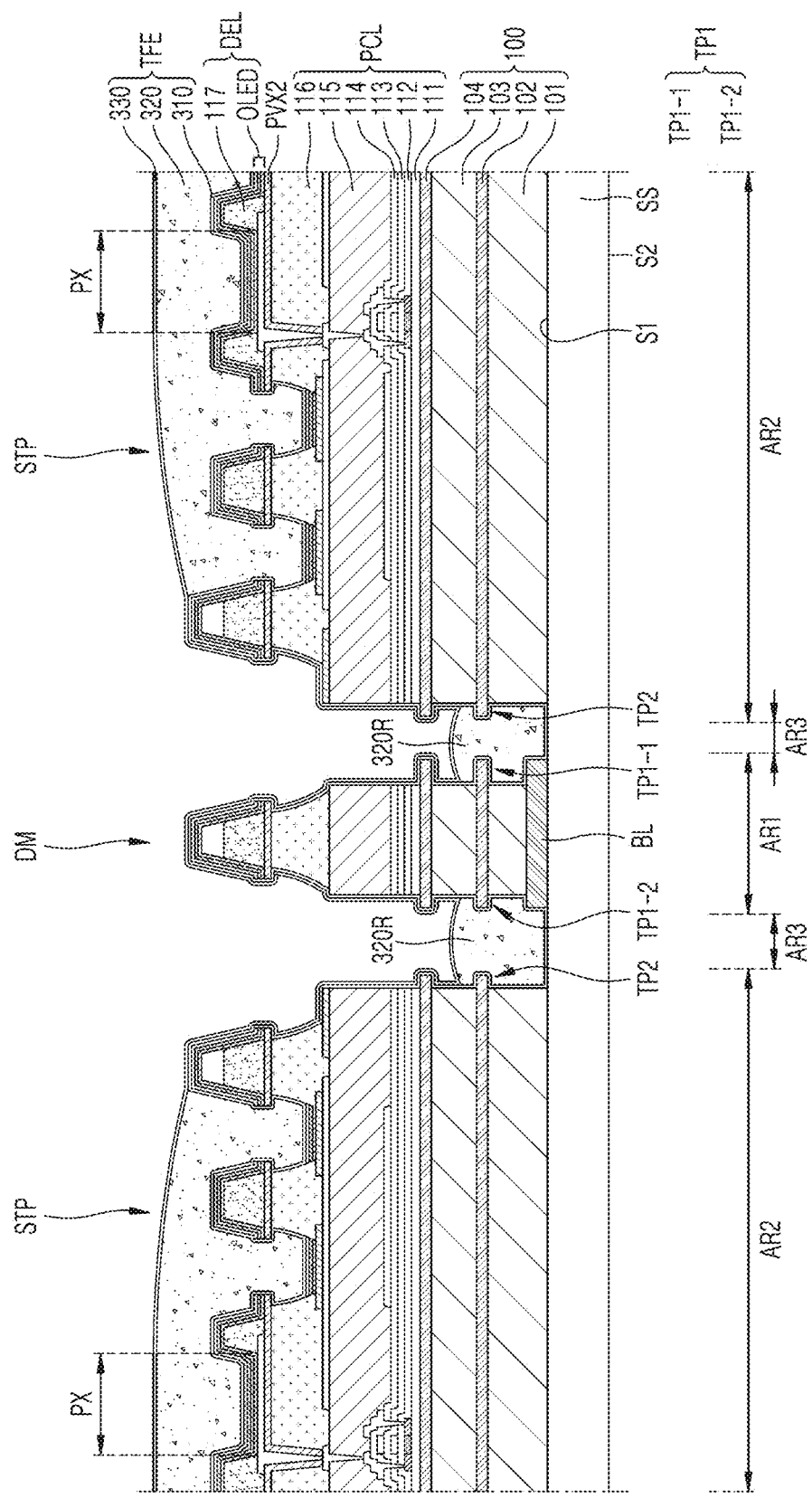
FIG. 13 is a cross-sectional view illustrating some operations of a method of manufacturing a display panel, according to an embodiment.

The dummy substrate 100DM in the first area AR1 and the dummy layers DML on the dummy substrate 100DM may be correctively referred to as a dummy portion DM (See FIG. 13). The dummy portion DM may be a portion that is not finally included in the display panel 10. That is, the dummy portion DM will be removed. The substrate 100 in the second area AR2 and the pixel circuit layer PCL and the display element layer DEL on the substrate 100 may be elements constituting the strip portion STP. The strip portion STP may be a portion that is finally included in the display panel 10.

As a portion of the first organic material layer 101M corresponding to the third area AR3 is removed, the dummy substrate 100DM and the substrate 100 may be spaced apart from each other with the third area AR3 therebetween. In a comparative example, in a state where a portion of the first organic material layer 101M corresponding to the third area AR3 is not removed, when the substrate 100 is separated from the support substrate SS in a subsequent process, the substrate 100 may be separated as if it is torn with an edge of the blocking layer BL as a boundary, thereby causing the problem that an end portion of the substrate 100 is not smooth. However, according to an embodiment, because the dummy substrate 100DM and the substrate 100 are spaced apart from each other and then the substrate 100 is separated from the support substrate SS in a subsequent process, the above problem may be solved.

According to an embodiment, the 1-1$^{th}$ inorganic material layer 102M1 of the dummy substrate 100DM may include a first tip TP1 protruding from a side surface of the 1-1$^{th}$ organic material layer 101M1 toward the substrate 100. The first tip TP1 may include a 1-1$^{th}$ tip TP1-1 and a 1-2$^{th}$ tip TP1-2. In a plan view, the 1-1$^{th}$ tip TP1-1 may correspond to a convex portion CV (see FIG. 12B) of an edge PT_E (see FIG. 12B) of each of a plurality of protrusions PT (see FIG. 12B) of the dummy substrate 100DM, and the 1-2$^{th}$ tip TP1-2 may correspond to a concave portion CC (see FIG. 12B) of the edge PT_E.

In a process of etching a portion of the first organic material layer 101M, an etching solution or an etching gas may penetrate further inward than an end portion of the 1-1$^{th}$ inorganic material layer 102M1 to etch the first organic material layer 101M. As a result, a side surface of the 1-1$^{th}$ organic material layer 101M1 that is an etched surface may be located more inward than the end portion of the 1-1$^{th}$ inorganic material layer 102M1. That is, the end portion of the 1-1$^{th}$ inorganic material layer 102M1 may protrude more toward the substrate 100 than the side surface of the 1-1$^{th}$ organic material layer 101M1 to form the first tip TP1. Likewise, the 1-2$^{th}$ inorganic material layer 102M2 of the substrate 100 may include a second tip TP2 protruding from a side surface of the 1-2$^{th}$ organic material layer 101M2 toward the dummy substrate 100DM. In a process of etching a portion of the first organic material layer 101M, because etching using an etching solution or an etching gas occurs on both sides of the third area AR3, an end portion of the 1-2$^{th}$ inorganic material layer 102M2 of the substrate 100 may also protrude more toward the dummy substrate 100DM than the side surface of the 1-2$^{th}$ organic material layer 101M2 to form the second top TP2.

In an embodiment, a protrusion length L1-1 of the 1-1$^{th}$ tip TP1-1 of the first tip TP1 of the dummy substrate 100DM may be greater than a protrusion length L1-2 of the 1-2$^{th}$ tip TP1-2. Also, the protrusion length L1-1 of the 1-1$^{th}$ tip TP1-1 of the dummy substrate 100DM may be greater than a protrusion length L2 of the second tip TP2 of the substrate 100. The protrusion length L1-2 of the 1-2$^{th}$ tip TP1-2 may be equal to or less than the protrusion length L2 of the second tip TP2. The reason why there is a difference between protrusion lengths of tips will be described below with reference to FIG. 12C.

The first tip TP1 of the dummy substrate 100DM may prevent a material located in the third area AR3 from being separated from the support substrate SS in a subsequent process. In detail, in the subsequent process, organic materials additionally stacked in the second area AR2 may be unintentionally accumulated in the third area AR3, and it is preferable that the organic materials are not included as foreign materials in the display panel 10. However, in a process of separating the strip portion STP of the second area AR2 from the support substrate SS, organic materials of the third area AR3 may be separated along with the strip portion STP due to the second tip TP2 of the substrate 100. In order to solve this problem, according to an embodiment, the 1-1$^{th}$ tip TP1-1 of the dummy substrate 100DM may be longer than the second tip TP2 of the substrate 100, so that the 1-1$^{th}$ tip TP1-1 firmly holds the organic materials of the third area AR3.

Referring to FIG. 12B, the dummy substrate 100DM may include a plurality of protrusions PT protruding toward the substrate 100. The substrate 100 may include a plurality of through-portions PN corresponding to the plurality of protrusions PT.

In a plan view, the edge PT_E of each of the plurality of protrusions PT of the dummy substrate 100DM may include an uneven portion. In an embodiment, the edge PT_E may include a plurality of convex portions CV and a concave portion CC between two adjacent convex portions CV. FIG. 12B illustrates that the edge PT_E includes a first convex portion CV1 and a second convex portion CV2, and a concave portion CC that is located between the first convex portion CV1 and the second convex portion CV2 and is relatively concave.

In an embodiment, for example, at least one of the first convex portion CV1 and the second convex portion CV2 may have a shape corresponding to a part of a circular shape in a plan view. Although each of the first convex portion CV1 and the second convex portion CV2 has a shape corresponding to a part of a circular shape in a plan view in FIG. 12B, the present disclosure according to the invention is not limited thereto.

In contrast, an edge PN_E of each of the plurality of through-portions PN of the substrate 100 may include a straight portion. That is, the edge PN_E of each of the plurality of through-portions PN may not include an uneven portion different from the edge PT_E of each of the plurality of protrusions PT.

The edge PT_E of the protrusion PT may correspond to an end portion of the 1-1$^{th}$ inorganic material layer 102M1 (see FIG. 12A) of the dummy substrate 100DM. A dashed line shown inside the edge PT_E of the protrusion PT may correspond to a side surface of the 1-1$^{th}$ organic material layer 101M1 (see FIG. 12A) located under the 1-1$^{th}$ inorganic material layer 102M1. Accordingly, an area between a solid line indicating the edge PT_E of the protrusion PT and the dashed line inside the solid line may be a portion where the first tip TP1 is located.

Likewise, the edge PN_E of the through-portion PN may correspond to an end portion of the 1-2$^{th}$ inorganic material layer 102M2 (see FIG. 12A). A dashed line shown inside the edge PN_E of the through-portion PN may correspond to a side surface of the 1-2$^{th}$ organic material layer 101M2 (see FIG. 12A) located under the 1-2$^{th}$ inorganic material layer 102M2. Accordingly, an area between a solid line indicating the edge PN_E of the through-portion PN and the dashed line inside the solid line may be a portion where the second tip TP2 is located. As shown in FIG. 12B, the first tip TP1 may be located along the edge PT_E of the protrusion PT, and a length of the first tip TP1 may vary according to a position of the first tip TP1. For example, a portion of the first tip TP1 corresponding to the convex portion CV of the protrusion PT may be longer than a portion of the protrusion PT corresponding to the concave portion CC. Referring to FIG. 12C, when the 1-1$^{th}$ organic material layer 101M1 (see FIG. 12A) is formed by etching a portion of the first organic material layer 101M (see FIG. 12A), because a contact area between a portion of the 1-1$^{th}$ organic material layer 101M1 corresponding to the convex portion CV and an etching solution or an etching gas is large, the portion of the 1-1$^{th}$ organic material layer 101M corresponding to the convex portion CV may be more exposed to the etching solution or the etching gas. Also, as indicated by dashed arrows in FIG. 12C, in a plan view, directions in which the portion of the 1-1$^{th}$ organic material layer 101M1 corresponding to the convex portion CV is etched may converge. Accordingly, a degree of etching in the portion of the 1-1$^{th}$ organic material layer 101M1 corresponding to the convex portion CV may overlap.

In contrast, a portion of the 1-1$^{th}$ organic material layer 101M1 corresponding to the concave portion CC may be less exposed to an etching solution or an etching gas. Also, in a plan view, directions in which the portion of the 1-1$^{th}$ organic material layer 101M1 corresponding to the concave portion CC is etched may be parallel to one another or may diverge. Accordingly, unlike the portion of the 1-1$^{th}$ organic material layer 101M1 corresponding to the convex portion CV, a degree of etching in the portion of the 1-1$^{th}$ organic material layer 101M1 corresponding to the concave portion CC may not overlap.

Accordingly, in a plan view, a portion of the 1-1$^{th}$ organic material layer 101M1 located on the convex portion CV may have a larger etched distance than a portion located on the concave portion CC, and thus a portion (e.g., 1-1$^{th}$ tip TP1-1 of FIG. 12A) of the first tip TP1 corresponding to the convex portion CV may have a relatively long protrusion length.

Also, due to a similar principle, a portion of the first tip TP1 of the dummy substrate 100DM may be longer than the second tip TP2 of the substrate 100. For example, a portion of the first tip TP1 corresponding to the convex portion CV may have a protrusion length greater than that of the second tip TP2.

As a comparative example, when each of the protrusion PT of the dummy substrate 100DM and the through-portion PN of the substrate 100 include an edge having no uneven portion, because the 1-1$^{th}$ organic material layer 101M1 of the protrusion PT and the 1-2$^{th}$ organic material layer 101M2 of the substrate 100 are exposed and etched at the same level by an etching solution or an etching gas at any position, and may have the same etched distance. Accordingly, protrusion lengths of the first tip TP1 of the dummy substrate 100DM and the second tip TP2 of the substrate 100 may be substantially the same. However, according to an embodiment, at least a portion of the first tip TP1 located on the protrusion PT of the dummy substrate 100DM may have a protrusion length greater than that of the second tip TP2 of the substrate 100.

FIG. 13 is a cross-sectional view illustrating some operations of a method of manufacturing a display panel, according to an embodiment.

Referring to FIG. 13, the thin-film encapsulation layer TFE may be formed on the substrate 100. As described above, the thin-film encapsulation layer TFE may include at least one inorganic encapsulation layer and at least one organic encapsulation layer. For example, the thin-film encapsulation layer TFE may include the first inorganic encapsulation layer 310, the organic encapsulation layer 320, and the second inorganic encapsulation layer 330 that are sequentially stacked.

The first and second inorganic encapsulation layers 310 and 330 may be formed over the entirety of the first through third areas AR3, whereas the organic encapsulation layer 320 may be formed only in the second area AR2. The organic encapsulation layer 320 may be located inside the partition wall portion W on the pixel PX. However, a monomer for forming the organic encapsulation layer 320 may undesirably overflow beyond the partition wall portion W. In this case, the overflowing monomer may be located in the third area AR3, to form a residue 320R.

The residue 320R has to remain on the support substrate SS, without being separated along with the substrate 100. When the residue 320R is separated along with the substrate 100 from the support substrate SS and is attached to a side surface of the strip portion STP of the substrate 100, the residue 320R that is a foreign material may lower the manufacturing quality of the display panel 10.

Figure 14:
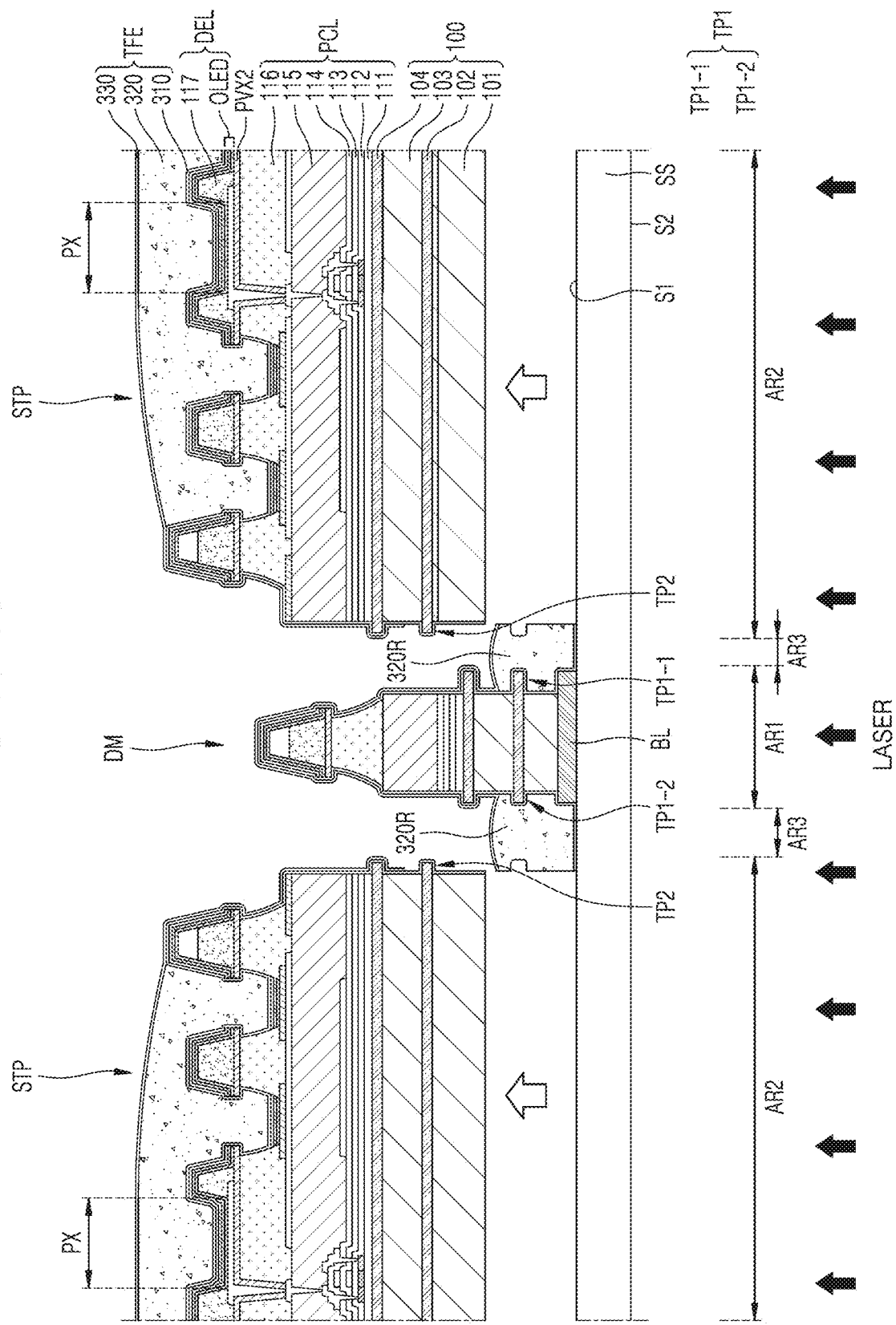
FIG. 14 is a cross-sectional view illustrating some operations of a method of manufacturing a display panel, according to an embodiment.

FIG. 14 is a cross-sectional view illustrating some operations of a method of manufacturing a display panel, according to an embodiment.

Referring to FIG. 14, the substrate 100 may be separated from the support substrate SS. In an embodiment, the substrate 100 and the support substrate SS may be separated from each other by using a laser release method for applying a laser to the substrate 100. The laser may be emitted from the bottom of the support substrate SS through the support substrate SS to the substrate 100. In other words, the laser may be emitted in a direction from the second surface S2 of the support substrate SS to the first surface S1. The laser may be, for example, an excimer laser having a wavelength of 308 nm, or a solid-state ultraviolet ("UV") laser having a wavelength of 343 nm or 355 nm.

The blocking layer BL may be located under the dummy portion DM, to absorb the laser. Accordingly, even when the laser is emitted, the dummy portion DM may remain without being separated from the support substrate SS. That is, the blocking layer BL on the support substrate SS and the dummy substrate 100DM on the blocking layer BL may not be separated from the support substrate SS. In contrast, because the blocking layer BL is not located under the strip portion STP, the substrate 100 and the support substrate SS of the strip portion STP may be separated from each other due to the laser.

Because there is no blocking layer even under the residue 320R located in the third area AR3, the residue 320R may be separated from the support substrate SS. In particular, the residue 320R may be separated along with the strip portion STP due to the second tip TP2 of the strip portion STP.

However, according to an embodiment, because the 1-1$^{th}$ tip TP1-1 of the dummy portion DM is longer than the second tip TP2 of the strip portion STP, when the substrate 100 is separated from the support substrate SS, the 1-1$^{th}$ tip TP1-1 of the dummy portion DM may firmly hold the residue 320R.

Also, as described above, because the protrusion PT (see FIG. 12B) includes an uneven portion, the first tip TP1 of the dummy portion DM may have a lager contact area with the residue 320R than the second tip TP2 of the strip portion STP. Accordingly, the first tip TP1 may firmly hold the residue 320R.

Accordingly, the residue 320R is not separated along with the strip portion STP, and remains in the third area AR3 on the support substrate SS. Accordingly, the manufacturing quality of the display panel 10 may be improved.

FIGS. 15A through 15J are plan views illustrating a protrusion of a dummy substrate formed in some operations of a method of manufacturing a display panel, according to other embodiments.

Referring to FIGS. 15A through 15J, the edge PT_E of each of the plurality of protrusions PT of the dummy substrate 100DM may include an uneven portion, and may have any of various shapes. Referring to FIGS. 15A through 15D, the edge PT_E of each of the plurality of protrusions PT may include convex portions, and at least one of the convex portions may have a shape corresponding to a part of a polygonal shape such as a triangular shape, a quadrangular shape, or a pentagonal shape in a plan view. Also, referring to FIG. 15E, at least one of the convex portions may have a shape corresponding to a part of an elliptical shape in a plan view. In some embodiments, referring to FIGS. 15G through 15I, each of the plurality of protrusions PT may have a serpentine shape.

Figure 15:
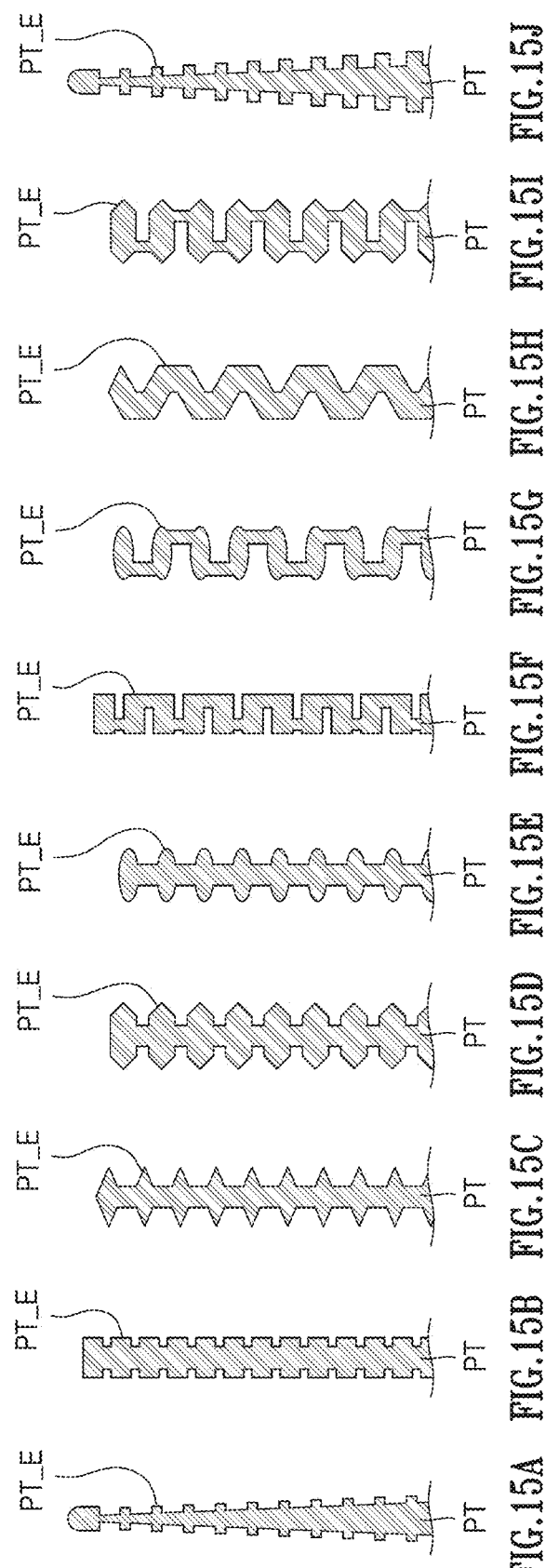
FIGS. 15A through 15J are plan views illustrating a protrusion of a dummy substrate formed in some operations of a method of manufacturing a display panel, according to other embodiments.

Referring to FIG. 15J, a size (i.e., a width) of the convex portions provided on the edge PT_E of each of the plurality of protrusions PT in a plan view may gradually decrease in a longitudinal direction of the plurality of protrusions PT. Because a width between the strip portions STP of the substrate 100 (see FIG. 12B) may decrease in the longitudinal direction of the protrusion portion PT, a design margin is considered. Even when the protrusion PT has a shape of any of FIGS. 15B through 15I, a width of the convex portions may gradually decrease in the longitudinal direction of the protrusion PT.

Figure 16:
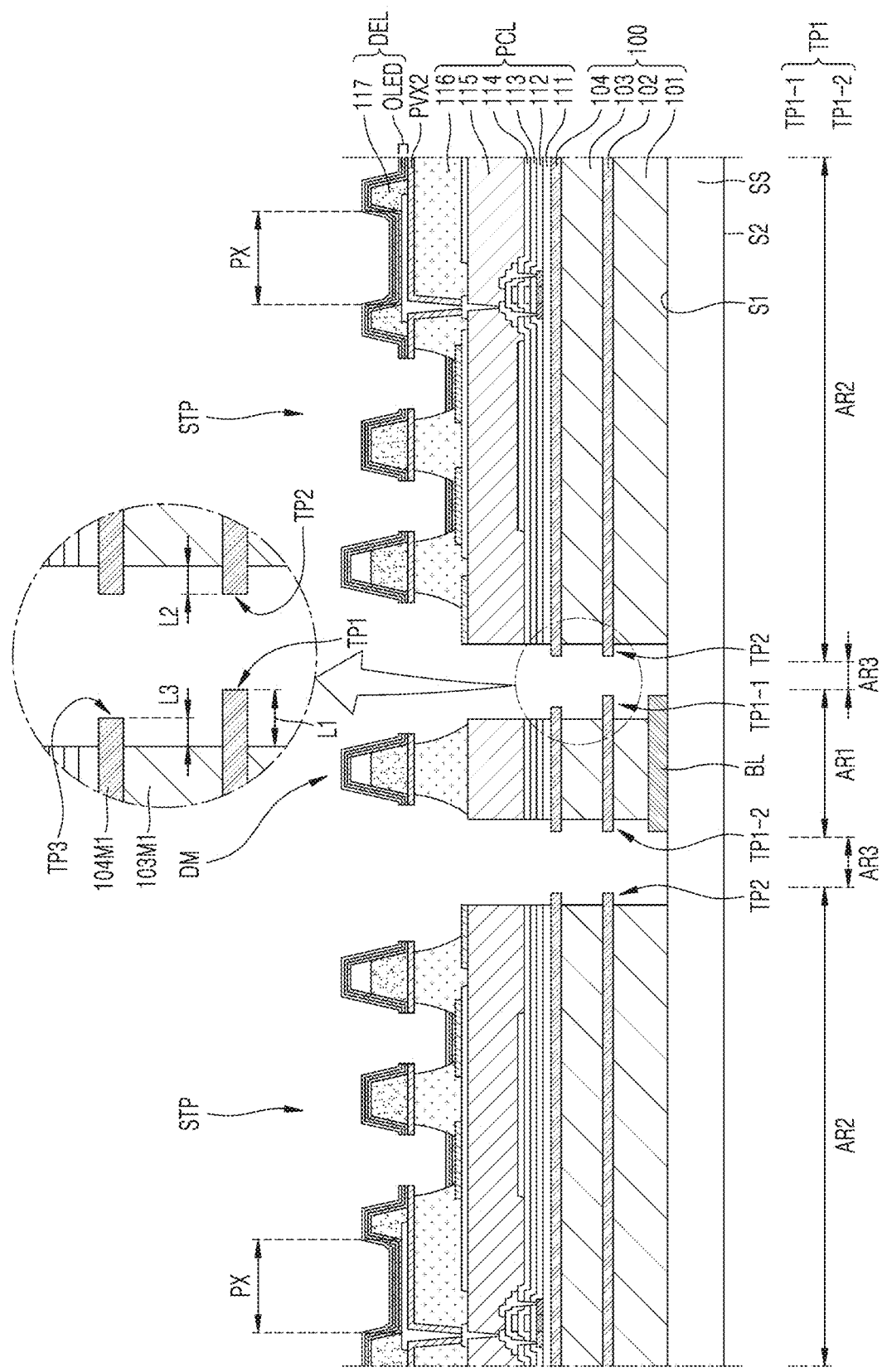
FIG. 16 is a cross-sectional view illustrating some operations of a method of manufacturing a display panel, according to another embodiment.

FIG. 16 is a cross-sectional view illustrating some operations of a method of manufacturing a display panel, according to another embodiment. Descriptions of the same or corresponding elements as those in FIG. 12A will be omitted, and the following will focus on a difference.

Referring to FIG. 16, the 2-1$^{th}$ inorganic material layer 104M1 of the dummy portion DM may further include a third tip TP3 protruding from a side surface of the 2-1$^{th}$ organic material layer 103M1 toward the substrate 100. In an embodiment, a protrusion length L1 of the first tip TP1 of the dummy portion DM may be greater than each of a protrusion length L2 of the second tip TP2 and a protrusion length L3 of the third tip TP3. The protrusion length L3 of the third tip TP3 may be greater than the protrusion length L2 of the second tip TP2 of the strip portion STP.

Because the residue 320R (see FIG. 13) located in the third area AR3 is accumulated from the first surface S1 of the support substrate SS, the protrusion length L1 of the first tip TP1 of the dummy portion DM closest to the first surface S1 may be the largest. In order to make the protrusion length L1 of the first tip TP1 greater than the protrusion length L3 of the third tip TP3, for example, types of etching solutions or etching gases for etching the 1-1$^{th}$ organic material layer 101M1 and the 2-1$^{th}$ organic material layer 103M1 may be different from each other, or the 1-1$^{th}$ inorganic material layer 102M1 and the 2-1$^{th}$ inorganic material layer 104M1 may be differently patterned.

According to the one or more embodiments, when a substrate on which elements of a display panel are formed is separated from a support substrate, a dummy substrate prevents materials that need to remain on the support substrate from being separated along with the substrate, thereby realizing a method of manufacturing the display panel which may improve the manufacturing quality of the display panel. However, the present disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A method of manufacturing a display panel, the method comprising:
preparing a support substrate comprising first to third areas, wherein the first area and the second area are spaced apart from each other, and the third area is disposed between the first area and the second area;
forming, on the support substrate, a blocking layer located in the first area;
forming, on the support substrate, a substrate material layer located in the first through third areas;
removing a portion of the substrate material layer corresponding to the third area, to form a dummy substrate in the first area and a substrate in the second area; and
separating the substrate from an entirety of the support substrate,
wherein the dummy substrate comprises a plurality of protrusions protruding toward the substrate, and
the substrate defines a plurality of through-portions corresponding to the plurality of protrusions,
wherein an edge of each of the plurality of protrusions comprises an uneven portion.

2. The method of claim 1, wherein an edge of each of the plurality of through-portions comprises a straight portion.

3. The method of claim 1, wherein the edge of each of the plurality of protrusions comprises a first convex portion, a second convex portion, and a concave portion, and the concave portion is located between the first convex portion and the second convex portion and is relatively concave,
wherein at least one of the first convex portion and the second convex portion has a shape corresponding to a part of a polygonal shape, a part of a circular shape, or a part of an elliptical shape in a plan view.

4. The method of claim 1, wherein each of the plurality of protrusions has a serpentine shape.

5. The method of claim 1, wherein the separating of the substrate from the support substrate comprises separating the substrate from the support substrate, by emitting a laser from a bottom of the support substrate to the substrate through the support substrate.

6. The method of claim 5, wherein, when the substrate is separated from the support substrate, the blocking layer and the dummy substrate on the blocking layer are not separated from the support substrate.

7. The method of claim 1, wherein the blocking layer comprises an amorphous silicon material.

8. The method of claim 1, further comprising:
forming, on the substrate material layer, a pixel circuit layer comprising a thin-film transistor; and
forming, on the pixel circuit layer, a display element layer comprising a display element electrically connected to the thin-film transistor.

9. A method of manufacturing a display panel, the method comprising:
preparing a support substrate comprising first to third areas wherein the first area and the second area are spaced apart from each other, and the third area is disposed between the first area and the second area;
forming, on the support substrate, a blocking layer located in the first area;
forming, on the support substrate, a substrate material layer located in the first through third areas;
removing a portion of the substrate material layer corresponding to the third area to form a dummy substrate in the first area and a substrate in the second area; and
separating the substrate from the support substrate,
wherein the dummy substrate comprises a plurality of protrusions protruding toward the substrate, and
the substrate defines a plurality of through-portions corresponding to the plurality of protrusions,
wherein an edge of each of the plurality of protrusions comprises an uneven portion,
wherein the forming of the substrate material layer comprises:
forming, on the support substrate, a first organic material layer located in the first through third areas; and
forming, on the first organic material layer, a first inorganic material layer comprising a 1-1$^{th}$ inorganic material layer corresponding to the first area and a 1-2$^{th}$ inorganic material layer corresponding to the second area.

10. The method of claim 9, wherein the removing of the portion of the substrate material layer corresponding to the third area comprises etching a portion of the first organic material layer corresponding to the third area,
wherein the etched first organic material layer comprises a 1-1$^{th}$ organic material layer in the first area and a 1-2$^{th}$ organic material layer in the second area.

11. The method of claim 10, wherein the dummy substrate comprises a stacked structure of the 1-1$^{th}$ organic material layer and the 1-1$^{th}$ inorganic material layer,
wherein the 1-1$^{th}$ inorganic material layer comprises a first tip protruding from a side surface of the 1-1$^{th}$ organic material layer toward the substrate.

12. The method of claim 11, wherein the substrate comprises a stacked structure of the 1-2$^{th}$ organic material layer and the 1-2$^{th}$ inorganic material layer,
wherein the 1-2$^{th}$ inorganic material layer comprises a second tip protruding from a side surface of the 1-2$^{th}$ organic material layer toward the dummy substrate.

13. The method of claim 12, wherein a protrusion length of at least a portion of the first tip is greater than a protrusion length of the second tip.

14. The method of claim 9, wherein the forming of the substrate material layer further comprises:
forming a second organic material layer covering the 1-1$^{th}$ inorganic material layer and the 1-2$^{th}$ inorganic material layer and located in the first through third areas; and forming, on the second organic material layer, a $2\text{-}1^{th}$ inorganic material layer corresponding to the first area and a $2\text{-}2^{th}$ inorganic material layer corresponding to the second area.

15. The method of claim 14, wherein the removing of the portion of the substrate material layer corresponding to the third area comprises etching portions of the first organic material layer and the second organic material layer that correspond to the third area,
wherein the etched first organic material layer comprises a $1\text{-}1^{th}$ organic material layer in the first area and a $1\text{-}2^{th}$ organic material layer in the second area, and
the etched second organic material layer comprises a $2\text{-}1^{th}$ organic material layer in the first area and a $2\text{-}2^{th}$ organic material layer in the second area.

16. The method of claim 15, wherein the dummy substrate comprises a stacked structure of the $1\text{-}1^{th}$ organic material layer, the $1\text{-}1^{th}$ inorganic material layer, the $2\text{-}1^{th}$ material layer, and the $2\text{-}1^{th}$ inorganic material layer,
wherein the $1\text{-}1^{th}$ inorganic material layer comprises a first tip protruding from a side surface of the $1\text{-}1^{th}$ organic material layer toward the substrate, and
the $2\text{-}1^{th}$ inorganic material layer comprises a third tip protruding from a side surface of the $2\text{-}1^{th}$ organic material layer toward the substrate.

17. The method of claim 16, wherein a protrusion length of the first tip is greater than a protrusion length of the third tip.

18. The method of claim 11, further comprising forming, on the substrate, a thin-film encapsulation layer comprising at least one inorganic encapsulation layer and at least one organic encapsulation layer,
wherein when the substrate is separated from the support substrate, a part of the at least one organic encapsulation layer remains on the support substrate due to the first tip.

19. The method of claim 18, wherein the part of the at least one organic encapsulation layer remaining on the support substrate is located in the third area.

20. A method of manufacturing a display panel, the method comprising:
preparing a support substrate comprising first to third areas, wherein the first area and the second area are spaced apart from each other, and the third area is disposed between the first area and the second area;
forming on the support substrate a blocking layer located in the first area;
forming, on the support substrate, a substrate material layer located in the first through third areas;
removing a portion of the substrate material layer corresponding to the third area to form a dummy substrate in the first area and a substrate in the second area; and
separating the substrate from the support substrate,
wherein the dummy substrate comprises a plurality of protrusions protruding toward the substrate, and
the substrate defines a plurality of through-portions corresponding to the plurality of protrusions,
wherein an edge of each of the plurality of protrusions comprises an uneven portion,
wherein the substrate comprises a plurality of strip portions located between the plurality of through-portions and defining the plurality of through-portions,
wherein the plurality of strip portions is located at a corner of the substrate.

21. The method of claim 20, further comprising reducing an interval between adjacent strip portions from among the plurality of strip portions.

* * * * *